US005084891A

United States Patent [19]

Ariyavisitakul et al.

[11] Patent Number: 5,084,891
[45] Date of Patent: Jan. 28, 1992

[54] TECHNIQUE FOR JOINTLY PERFORMING BIT SYNCHRONIZATION AND ERROR DETECTION IN A TDM/TDMA SYSTEM

[75] Inventors: Sirikiat Ariyavisitakul, Eatontown; Li F. Chang, Marlboro; Nelson R. Sollenberger, Tinton Falls, all of N.J.

[73] Assignee: Bell Communications Research, Inc., Livingston, N.J.

[21] Appl. No.: 404,946

[22] Filed: Sep. 8, 1989

[51] Int. Cl.$^5$ .................. H04L 7/00; H03M 13/00
[52] U.S. Cl. .................................................. 371/42
[58] Field of Search ............................ 371/42, 47.1

[56] References Cited

U.S. PATENT DOCUMENTS 3,550,082 12/1970 Tong ............................ 371/42
3,571,794 3/1971 Tong ............................ 371/42

OTHER PUBLICATIONS

Cox, "Portable Digital Radio Communications—An Approach to Tetherless Access", IEEE Communications Magazine, vol. 27, No. 7, Jul. 1989, pp. 30–40.
Cox, "Universal Digital Portable Radio Communications", Proceedings of the IEEE, vol. 75, No. 4, Apr. 1987, pp. 436–476.
Scholtz, "Frame Synchronization Techniques", IEEE Transactions on Communications, vol. COM-28, No. 8, Aug. 1980, pp. 1204–1213.
Peterson et al, Error-Correcting Codes (Second Edition) ©1972, The MIT Press, Cambridge, Mass.) specifically section 7.2 "Multiplication and Division of Polynomials" on pp. 171–178, section 8.8, Error Detection with Cyclic Codes on pp. 228–230, and chapter 12 Synchronization of Block Codes on pp. 374–391 thereof.
Stiffler, Theory of Synchronous Communication (©1971, Prentice Hall Pub. Co., Englewood Cliffs, N.J.) specifically chapter 14 "Synchronizable Error-Correcting Codes" on pp. 453–511 thereof.
Tavares et al, "Further Results on the Synchronization of Binary Cyclic Codes", IEEE Transactions on Information Theory, Mar. 1970, pp. 238–241.
Tavares et al, "Synchronization of a Class of Codes Derived from Cyclic Codes", Information and Control, vol. 16, 1970, pp. 153–166.
Tavares et al, "Synchronization of Cyclic Codes in the Presence of Burst Errors", Information and Control, vol. 14, 1969, pp. 423–441.
Tong, "Synchronization Recovery Techniques for Binary Cyclic Codes", The Bell System Technical Journal, Apr. 1966, pp. 561–596.

Primary Examiner—Stephen M. Baker
Attorney, Agent, or Firm—Leonard Charles Suchyta; James W. Falk

[57] ABSTRACT

A technique for bit synchronization and error detection of received digital data bursts in a TDM/TDMA system, such as that which will be used with low power portable digital telephony. A cyclically redundant codeword, e.g. a (161,147) codeword, is formed for transmission, using e.g. either a TDM packet or TDMA burst. The first and last bits in the codeword are then inverted to form a first set of marker bits. At a receiver, a second set of marker bits is inserted into a received word, again through inverting the first and last bits. The resulting marked word is then rotated by a pre-determined number of bits to place potentially erroneous bits at the end of this word. A multi-bit timing syndrome value is then determined and is used to access a look-up table for a value of bit slippage. The received word is advanced or retarded as specified by the bit slippage value to yield an intermediate word. The marker bits are removed from the intermediate word to yield an unmarked word for which an error syndrome value is determined. If the error syndrome value is zero, then the unmarked word is a synchronized substantially error-free codeword. If the unmarked word contains excessive bit slippage or bit errors indicated by an excessive value of the timing syndrome or a non-zero valued error syndrome, an indication is provided to ignore this word.

38 Claims, 13 Drawing Sheets

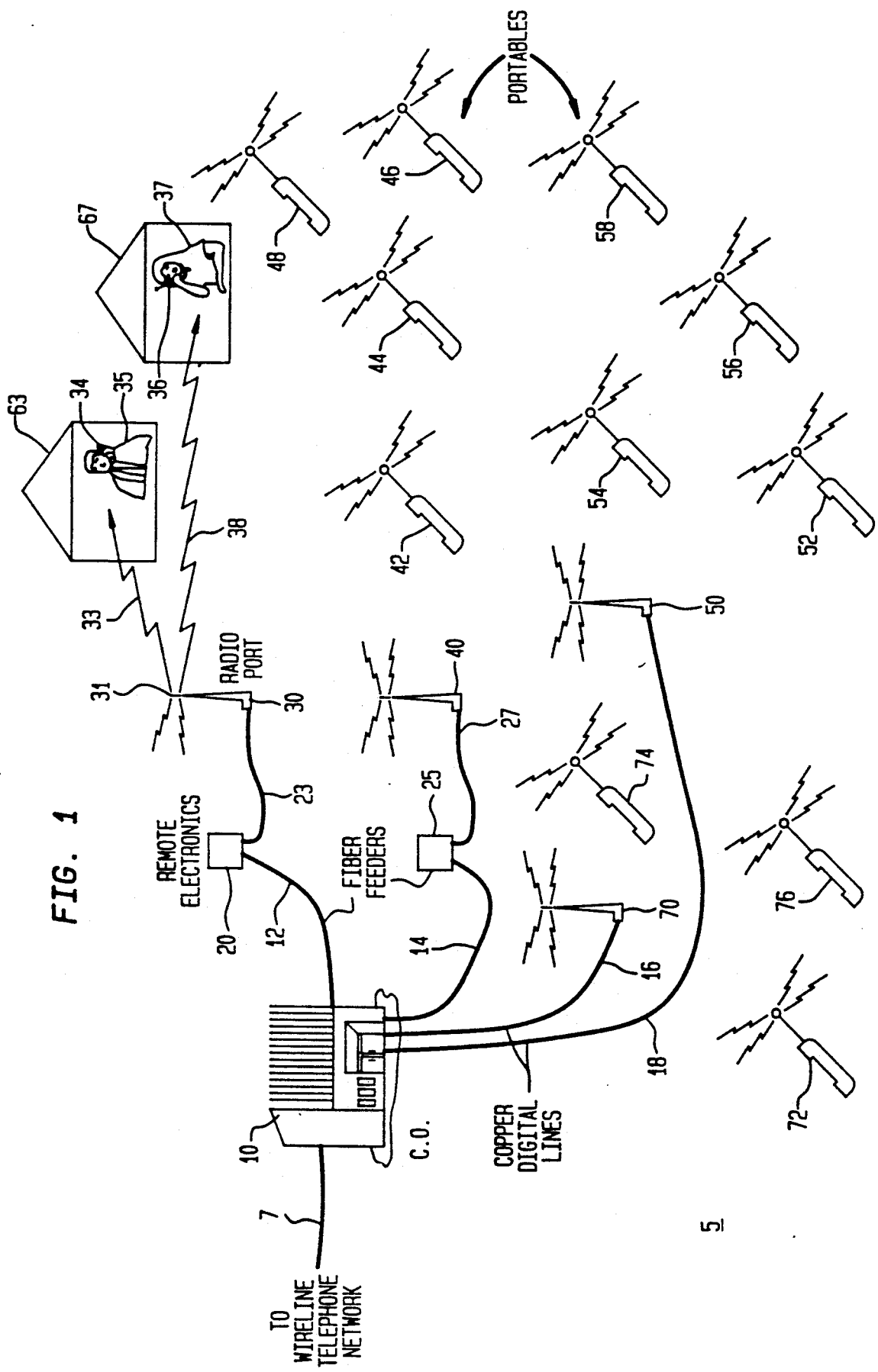

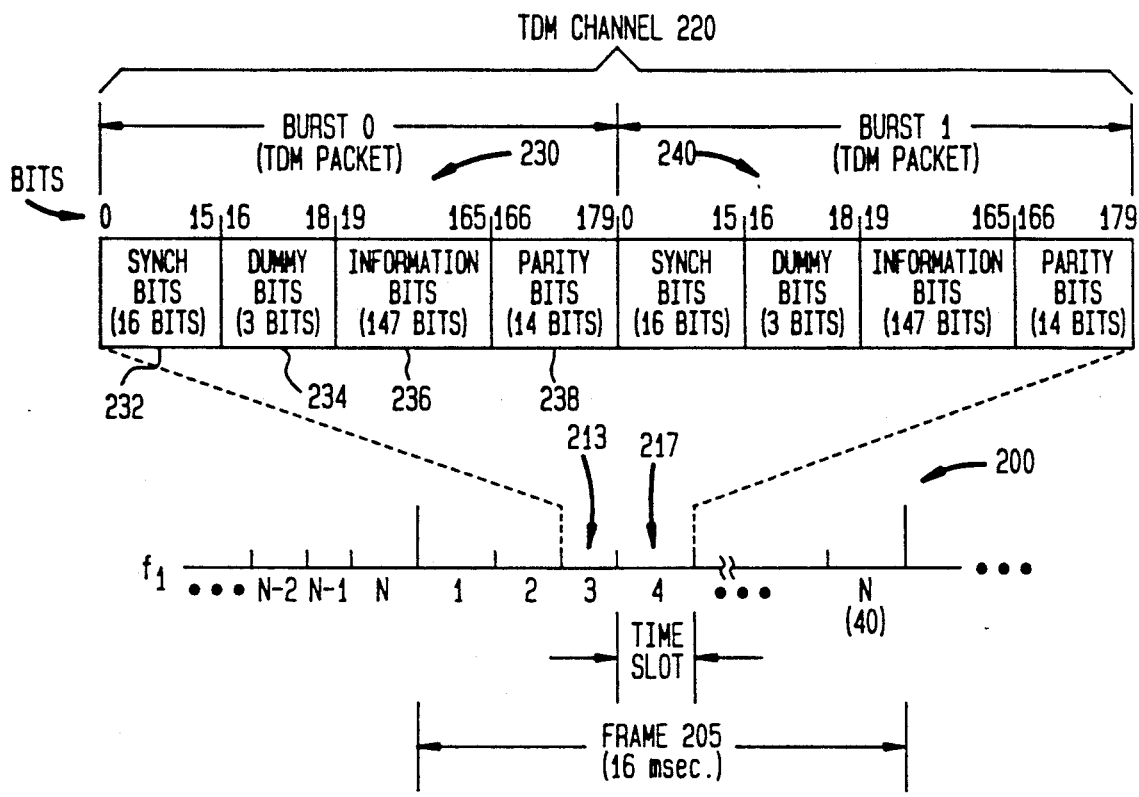
FIG. 2A  PORT TO PORTABLE COMMUNICATION (SPEECH @ 16kbit/sec.):
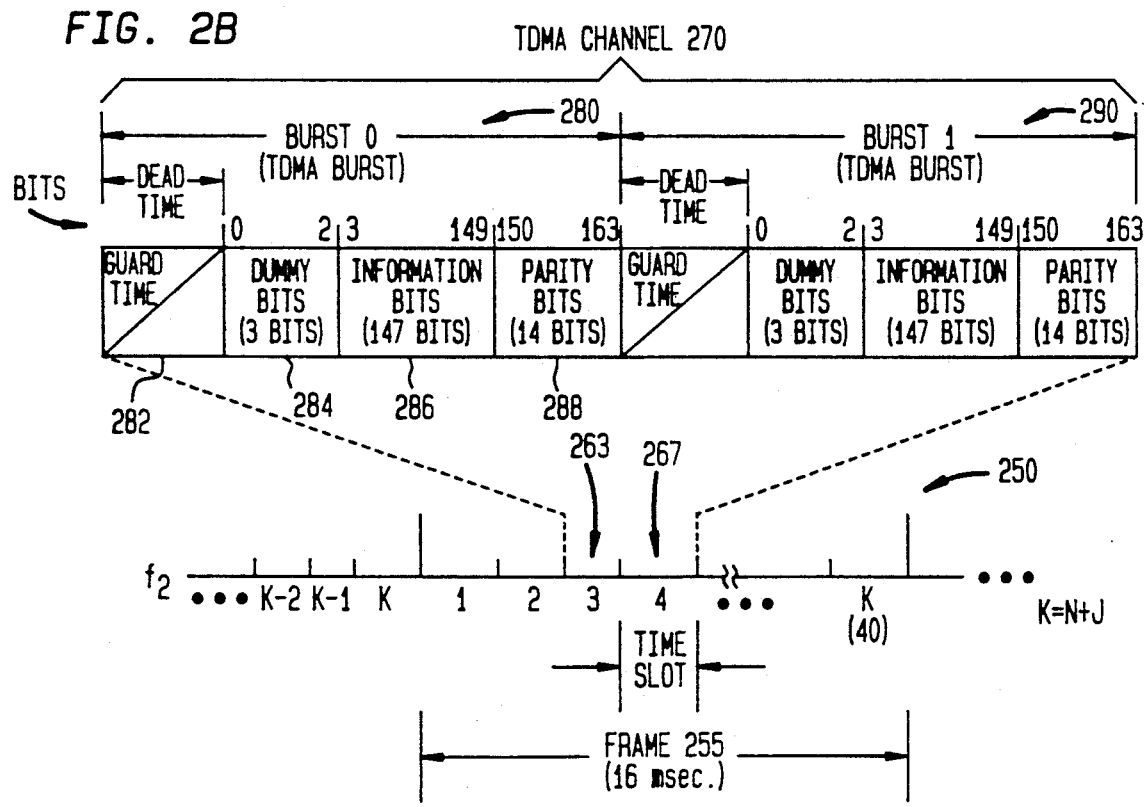
FIG. 2B  PORTABLE TO PORT COMMUNICATION (SPEECH @ 16kbit/sec.):

PORT CIRCUITRY g(x) DIVIDER

FIG. 6

SYNCH ESTIMATION V. TIMING SYNDROME TABLE

| SYNCH ESTIMATION (BURST TIMING OFFSET) | TIMING SYNDROME | | | | | | | | | | | | |
|---|---|---|---|---|---|---|---|---|---|---|---|---|---|
| -6 | 0 | 0 | 0 | 0 | 0 | 0 | 1 | X | X | X | X | X | 1 |
| -5 | 0 | 0 | 0 | 0 | 0 | 0 | 1 | X | X | X | X | 1 | 0 |
| -4 | 0 | 0 | 0 | 0 | 0 | 0 | 1 | X | X | X | 1 | 0 | 0 |
| -3 | 0 | 0 | 0 | 0 | 0 | 0 | 1 | X | X | 1 | 0 | 0 | 0 |
| -2 | 0 | 0 | 0 | 0 | 0 | 0 | 1 | X | 1 | 0 | 0 | 0 | 0 |
| -1 | 0 | 0 | 0 | 0 | 0 | 0 | 1 | 1 | 0 | 0 | 0 | 0 | 0 |
| 0 | 0 | 0 | 0 | 0 | 0 | 0 | 0 | 0 | 0 | 0 | 0 | 0 | 0 |
| 1 | 0 | 0 | 0 | 0 | 0 | 1 | X | 1 | 0 | 0 | 0 | 0 | 0 |
| 2 | 0 | 0 | 0 | 0 | 1 | X | X | 1 | 0 | 0 | 0 | 0 | 0 |
| 3 | 0 | 0 | 0 | 1 | X | X | X | 1 | 0 | 0 | 0 | 0 | 0 |
| 4 | 0 | 0 | 1 | X | X | X | X | 1 | 0 | 0 | 0 | 0 | 0 |
| 5 | 0 | 1 | X | X | X | X | X | 1 | 0 | 0 | 0 | 0 | 0 |
| 6 | 1 | X | X | X | X | X | X | 1 | 0 | 0 | 0 | 0 | 0 |

610

NOTE: "X" DENOTES AN UNDETERMINED STATE

CHANNEL CODER

PORTABLE CIRCUITRY (DETAILED)

MULTIPLEXED g(x) DIVIDER CIRCUIT

TECHNIQUE FOR JOINTLY PERFORMING BIT SYNCHRONIZATION AND ERROR DETECTION IN A TDM/TDMA SYSTEM

BACKGROUND OF THE DISCLOSURE

1. Field of the Invention

The invention relates to a technique for jointly performing bit synchronization and error detection of received digital data bursts in a time division multiplexed/time division multiple access (TDM/TDMA) system, such as that which will be used in conjunction with low power portable digital telephony.

2. Description of the Prior Art

People by their very nature are highly mobile; no where is this more true than in modern day society with its myriad forms of travel. At the same time, many people increasingly have a need to be able to telephonically communicate with others particularly while they are on "the go", i.e. while they are moving.

However, this need for mobile communications, which existed for quite some time, has remained basically unsatisfied. Since telephones traditionally have cords, any movement of the telephone was traditionally limited by the length of its cord. For many years, only a veritable handful of telephones actually traveled with their users. These mobile telephones included aeronautical, marine and other forms of early radio telephones. Inasmuch as these mobile telephones were priced well beyond the affordability of the average telephone subscriber, none of these radio telephones ever encountered widespread use. Accordingly, for the vast majority of subscribers, a telephone set was installed at each subscriber location and there it remained unless it was re-installed elsewhere. Thus, these subscribers either remained close to their telephone and thus restricted their mobility particularly in the anticipation of receiving a telephone call, or intentionally sought out a public or private telephone located along their route of travel whenever the need arose to place a telephone call.

Now with increasing sophistication of miniaturized electronic technology and decreasing attendant cost thereof, various vendors provide a number of devices (and/or services) that offer tetherless telephony. These devices, explained in more detail below, attempt to free a subscriber from being bound by the ambulatory constraints imposed by existing wireline telephone sets. In effect, each of these devices now permits subscribers effectively, at least within a certain extent, to take their telephone with them, obtain exchange access, and remain in communication wherever they go. These devices include cordless telephones, cellular mobile radio transceivers, public packet radio data network transceivers and radio pagers. As a growing number of consumers perceived the freedom of movement offered by these devices, a large demand was created for these devices. Moreover and not unexpectedly, as the prices of these devices continue to fall due to manufacturing economies and technical developments, the demand for these devices correspondingly continues to substantially increase. Specifically, approximately 25 million cordless telephone sets are in use today throughout the United States with demand for these sets continuing to rise as the price of cordless telephones with increasing sophisticated has remained within a $100.00 to $200.00 range. In addition, approximately three million cellular telephone sets are currently in use throughout the United States. As the price of various cellular sets falls from more than a $1000.00 which occurred merely a year ago to only a few hundred dollars today, the demand for these sets has increased precipitously. As a result, the number of installed sets has climbed at such an astonishing rate that in certain urban areas, such as New York, the number of sets in use at peak times is beginning to strain the capacity of the existing cellular network to handle the concomitant call traffic.

While each of the present tetherless telephonic technologies possesses certain advantages, each technology also unfortunately has certain drawbacks that significantly restrict its use. In this regard, see, e.g., Cox, "Portable Digital Radio Communications—An Approach to Tetherless Access", *IEEE Communications Magazine*, Vol. 27, No. 7, July 1989 pages 30–40; and Cox, "Universal Digital Portable Radio Communications", *Proceedings of the IEEE*, Vol. 75, No. 4, April 1987, pages 436–476.

Specifically, as to cordless telephones, such a telephone consists of two transceivers: a base unit and a handset, that collectively form a low power duplex analog radio link. The base unit is connected, typically by a subscriber to a wireline access point in a conventional telephone network in lieu of or as a replacement for a wireline telephone, in order to implement a tetherless substitute for a telephone cord. Once connected, the base unit appears to the telephone network as a conventional telephone. The base unit contains a transmitter and a receiver, and simple control and interface apparatus for dialing, accepting ringing, terminating calls and coupling voice from the telephone line to the transmitter and from the receiver within the base unit to the telephone line. The handset, which is truly portable, contains simple control logic for initiating, receiving and terminating calls with the base unit and for turning its own transmitter on and off. To provide true duplex operation, separate carrier frequencies are used by the transmitters in the base unit and handset. Since cordless telephones operate with very low input power to their transmitter, usually on the order of only several milliwatts, the handset generally utilizes several small rechargeable batteries as its power source. This enables the handset to be made relatively small, lightweight and to be continuously used for a relatively long period, typically several hours, before its batteries require recharging. Furthermore, the very low level of power radiated from the handset poses essentially no biological radiation hazard to its user.

Unfortunately, the primary disadvantage of cordless telephones is their highly limited service area. Because cordless telephones use relatively low transmitter power, these telephones have a maximum range that varies from typically a few hundred to a thousand feet, which in turn results in a very small service area. A secondary disadvantage associated with cordless telephones stems from the limited number of available frequencies. At present, only a few separate frequencies, typically up to 10 duplex channels, have been allocated by the Federal Communications Commission (FCC) for use by cordless telephones. Moreover, early cordless telephones by their very design have been very susceptible to co-channel interference. This interference arises by the simultaneous operation of two or more cordless telephones situated in close proximity to each other, such as in an immediate neighborhood of a residential area. In a very small geographic area with a very low density of users, a reasonable probability exists that within this area one or more duplex pairs will not be in use at any one time, and, as such, this interference will not occur therein. Nevertheless, in an effort to avoid this interference, relatively sophisticated cordless telephones are now capable of operating on any one of a number of pre-programmed duplex pairs with either the user or the telephone itself selecting, manually in the case of the user and automatically by the telephone, the specific pair that is to be used at any one time. Unfortunately, if a sufficient number of cordless telephones are in use in a very densely populated area, such as an apartment building, pair selection may not be sufficient to eliminate the expected incidences of co-channel interference that results from undisciplined and uncoordinated duplex pair assignment and the resulting chaos experienced by users situated therein. In addition, since cordless telephones rely on analog modulation of a duplex pair, conversations occurring over a cordless telephone are highly vulnerable to eavesdropping. Furthermore, a cordless telephone only provides limited protection against unauthorized long distance or message units calls being made therethrough. While pre-programmed digital or tone access codes are being used between individual handset-base unit pairs and provide sufficient protection against casual attempts at unauthorized access, these codes are not sufficiently sophisticated to successfully deter a determined orderly assault on a cordless telephone by an unauthorized user. Furthermore, while cordless telephones provide limited portable radio access to a wireline access point, from a network standpoint cordless telephones do not eliminate the need for telephone lines, i.e. a customer drop, to be run to each subscriber.

Nonetheless, in spite of these severe service restrictions, cordless telephones are immensely popular for the freedom, though very limited, that they furnish to their users.

In contrast to the very limited range provided by cordless telephones, cellular mobile radio systems accommodate wide ranging vehicular subscribers that move at relatively high speeds. These systems utilize a relatively high power 850 MHz transmitter, typically operating at an input of approximately 0.5 watt to several tens of watts, in a mobile unit with a relatively high efficiency antenna to access a wireline telephone network through a fixed cell-site (base station). The base station also uses a high power transmitter in conjunction with a tall antenna, typically erected on a tower or tall building, to provide a relatively large coverage area. Due to the expense, typically ranging to $300,000 exclusive of land and building costs, and the antenna size associated with each base station, the least number of base stations is often used to cover a given area. Nonetheless, this arrangement generally provides a circular service area centered on a base station with a radius of approximately 5-10 miles therefrom. In use, a cellular radio system that covers a large region often encompassing a city, its suburbs and major access highways typically includes a number of geographically dispersed base stations. The base stations, containing radio receivers and transmitters and interface and control electronics, are connected by trunks to, and coordinated and controlled by one or more Mobile Telephone Switching Offices (MTSOs) that, in turn, also provide access to the conventional wireline telephone network. All of the duplex radio channels available to the entire system are sub-divided into sets of channels. The radio equipment in each base station has the capability of using channels from one of the channel sets. These sets are allocated to the base station in a pattern that maximizes the distance between base stations that use the same sets so as to minimize average co-channel interference occurring throughout a service region. One or more channels are designated for initial coordination with the mobile sets during call setup.

Each mobile (or hand-held) cellular transceiver used in the system contains a receiver and a transmitter capable of operating on any duplex radio channel available to the cellular system. Calls can be made to or from any mobile set anywhere within the large region covered by a group of base stations. The control electronics in the mobile transceiver coordinates with a base station on a special call setup channel, identifies itself, and thereafter tunes to a channel designated by the base station for use during a particular call. Each duplex channel uses one frequency for transmission from base-to-mobile and a different frequency for transmission from mobile-to-base. The signal strength of calls in progress is monitored by the base stations that can serve those calls. Specifically, when the signal strength for a given call drops below a pre-determined threshold, typically due to movement of the cellular subscriber from one cell to another, the MTSO connected to that base station coordinates additional signal strength measurements from other base stations which surround the station that is currently handling the call. The MTSO then attempts to switch ("handoff") the call to another duplex channel if one of the other base stations is receiving a stronger signal than that being received at the base station that is currently handling the call. This handoff of calls, totally transparent to the cellular subscriber, preserves the quality of the radio circuit as the subscriber moves throughout the service region. Moreover, calls are handed off from one MTSO to another, as the subscriber transits from one service area into another. Inasmuch as frequency usage is coordinated, relatively efficient use is made of the available frequency spectrum while minimizing the likelihood co-channel interference. In each different geographic service area within the United States, there are two competing cellular systems using different frequencies.

Though cellular mobile radio systems provide wide range, these systems suffer various drawbacks. First, cellular systems were originally designed for use in motor vehicles whose electrical systems could readily provide sufficient power. While portable hand-held cellular transceivers do exist, they must operate with sufficient transmitter input power, typically at least 0.5 watt, to reliably reach a base station. This, in turn, requires that a relatively large battery must be used within the portable cellular transceiver. However, due to the limits of present rechargeable battery technology, the amount of time that the portable transceiver can be used before it requires recharging is often quite limited. Furthermore, the cost of these rechargeable batteries and hence of the portable transceiver is rather high. Moreover, high radiated power levels, such as that which emanate from a mobile or portable cellular transceiver, may be sufficient to pose a potential biological radiation hazard to its user. Furthermore, since cellular systems were not designed to compensate for radio attenuation occurring within buildings, these systems are only able to provide little, if any, service within a building. Low power portable cellular transceivers are neither operationally compatible with large cell sizes nor designed to match the needs of fast moving vehicular user and thus often provide poor communication in many areas within these cells. In addition, since cellular systems rely on merely frequency modulating a carrier with voice or data, these systems are also susceptible to eavesdropping. Lastly, from a network perspective, cellular systems are quite inefficient. Due to the inclusion of MTSOs with trunks connected to individual base stations, backhaul of cellular traffic, over wired trunks, often occurs over several miles prior to its entrance into the wireline network, thereby resulting in a wasteful overbuild of network transport facilities.

Public packet radio data networks presently exist to handle infrequent bursts of digital data between a fixed base station and a number of portable data transceivers. The fixed site has a transmitter that uses several tens of watts; while each portable data transceiver uses a transmitter that operates at a level of several watts. As such, reliable coverage is provided over a service area that may extend several miles in radius from a base station. Individual base stations are connected by a fixed distribution facility to a controller that can, in turn, be connected to either a local exchange network, to handle voice-band data, or a packet-data network which itself interconnects various computers. Multiple users contend for transmission time on typically a single radio channel. Data transmissions on the channel are set up in either direction through bursts of coordinating data, i.e. handshaking, that occur between a base station and a portable data transceiver. Appropriate controller and radio link protocols are used to avoid packet collisions. Once a data transfer is complete between that base station and a data transceiver, the channel is immediately available for re-use by others. Although data bursts are transmitted at relatively high power, each burst is transmitted for only a short duration. As such, the average power consumption for a portable data transceiver is far less than that associated with a portable cellular transceiver thereby allowing physically smaller internal batteries to be used with portable data transceivers than those used in portable cellular transceivers. Nevertheless, the high radiated power levels associated with a portable data transceiver again pose a potential biological radiation hazard to its user. In addition, these networks disadvantageously suffer from limited digital transmission capacity which restricts these networks to carrying short data bursts and not voice, and, like cellular systems, experience coverage restraints when used within buildings.

In contrast to the tetherless systems discussed above, radio paging systems provide simple unidirectional transmission from a fixed location to a specifically addressed portable pager, which when received provides an alerting tone and/or a simple text message. Paging systems provide optimized one-way communication over a large region through a high power transmitter, typically a few kilowatts, that uses high antennas at multiple sites to provide reliable coverage throughout the region. Satellite based paging systems are also in operation to provide extended service regions. Since a pager is merely a receiver with a small annunciator, its power requirement is very low. As such, a pager is quite small, light weight, reliable, relatively low cost, and can operate for long intervals before its batteries need to be recharged or replaced.

Due to the advantages in size, cost and operating duration offered by pocket pagers, attempts exist in the art, to impart limited two-way communication into paging systems which are themselves highly optimized for one-way traffic. One such attempt includes incorporation of an "answer back" message through "reverse" transmission links between the individual pagers and the fixed sites. While these attempts have met with great difficulty, these attempts nevertheless indicate that a substantial demand exists for an inexpensive two-way portable truly tetherless telephonic service that overcomes the range limitations associated with cordless telephones and the weight and cost limitations associated with portable cellular systems.

Furthermore, various intelligent network services are now being offered by the local telephone operating companies in an attempt to provide wireline subscribers with a certain degree of call mobility when they are away from their own wireline telephones. These services include call transfer and call forwarding. Both call transfer and call forwarding allow a subscriber to program a local switch, using any pushbutton telephone, to transfer all subsequently occurring incoming calls that would otherwise be routed to this subscriber's telephone to a telephone associated with a different wireline telephone number that the subscriber desires anywhere in the world either for a given period of time, as in call transfer, or until that subscriber appropriately re-programs the switch with a different forwarding number, as in call forwarding. In this manner, the subscriber can, to a certain extent, continually instruct the telephone network to follow his or her movements and thereby route his or her incoming calls to a different number in unison with that subscriber's actual route of travel. Unfortunately, with these services, the subscriber must manually interact with the network and continually enter a new forwarding telephone number(s) coincident with his or her continuing travel such that the network is always cognizant of the current telephone number to which his calls are to be forwarded.

Thus, a substantial overall need exists in the art for a truly portable personal communication technology that is designed for pedestrian use and which utilizes small, lightweight and relatively inexpensive portable transceivers while eliminating, or at least substantially reducing, the performance drawbacks associated with the use of currently existing tetherless telephonic technologies in portable communication applications.

In an attempt to provide this needed technology, the art has turned to low power portable digital telephony. In essence, this technology, similar to cellular radio, uses a fixed base unit (hereinafter referred to as a port) and a number of mobile transceivers (hereinafter referred to as portables) that can simultaneously access that port on a multiplexed basis. However, in contrast to cellular radio, portable digital telephony uses low power multiplexed radio links that operate on a time division multiplexed/time division multiple access (TDM/TDMA) basis to provide a number of separate fully duplex demand-assigned digital channels between a port and each of its associated portables. Specifically, each port would transmit time division multiplexed (TDM) bit streams on a pre-defined carrier frequency, with, in turn, each portable that accesses that port responding by transmitting a TDMA burst on a common, though different, pre-defined carrier frequency from that used by the port. Quadrature phase shift keying (QPSK), with an inter-carrier spacing of 150 to 300 KHz and within a given operating frequency band situated somewhere between approximately 0.5 to 5 GHz would be used by both the port and portables. The power used by the transmitter in the portable would range between 5-10 milliwatts or less on average and provide a range of several hundred to a thousand feet. As such, the resulting low radiated power would pose essentially no biological radiation hazard to any user. In addition, the port antenna would be relatively small and suitable for mounting on a utility or light pole. With this transmission range, a port could simultaneously serve typically 20-30 separate locally situated portables. The same TDM channels would be re-used at ports that are spaced sufficiently far apart to reduce co-channel interference to an acceptably low level but yet conserve valuable spectrum To provide access to the wireline telephone network, each port would be interfaced, typically through a conventional fixed distribution facility, over either a copper or fiber connection to a switching machine at a local central office. The switching machine would be suitably programmed, in a similar manner as is an MTSO, to controllably and automatically handoff calls from one port to another as subscribers move their portables from port to port.

Due to the very limited transmitter power, each portable is anticipated to be very light-weight, physically small and provide a relatively long operating life between battery recharging or replacement. The cost to a subscriber for a portable is expected, through very large scale integrated (VLSI) circuit implementations, to reside in the range of $100.00 to $350.00. In addition, each port would require a relatively small electronic package and carry an overall expected cost of less than $25,000.00—which is far less, by at least an order of magnitude, than that of a current cellular base station. Moreover, the digital data carried on each channel could be readily encrypted to provide a desired degree of security and privacy against eavesdropping. Furthermore, with this technology, a port antenna, due to its small size, could be readily moved within a building to cope with signal attenuation occurring therein. Port spacings would be properly established within the building and frequency re-use would be properly controlled between these ports to provide portable service having an acceptably low level of co-channel interference to a high density of users situated therein.

From a network perspective, low power portable digital telephony is extremely attractive. At present, approximately $50-100 Billion is invested by local operating telephone companies in costs associated with copper subscriber loops that run from distribution points to local telephone company demarcation points on individual customer drops. For a local telephone company, the per-subscriber cost of installing and maintaining a subscriber loop is generally greater at the loop end closest to a subscriber than at the far end thereof since the loop end is more dedicated to that subscriber than the far end is. Given the range provided by portable low power telephony, ports can be appropriately positioned throughout an area to provide radio link based exchange access and thereby substitute inexpensive mass produced VLSI circuitry for costly dedicated copper loops that would otherwise emanate from a distribution facility to an individual subscriber. Hence, by installing various ports throughout for example a building, significant labor intensive installation and maintenance tasks associated with re-wiring of telephone drops and re-location of telephone equipment would be eliminated with substantial savings being advantageously realized in attendant subscriber costs as people are moved from office to office therein.

Now, with the attractiveness of low power portable digital telephony being readily apparent, its success, in great measure, hinges on achieving satisfactory performance through the use of TDMA. TDMA, as currently envisioned for use in low power portable digital telephony, will utilize time multiplexed 164-bit bursts for communication from each of the portables to an associated port and 180-bit TDM packets for communication from that port to each of these portables. To yield a data rate of 16 kbits/second, two successive TDM/TDMA time slots are assigned by the port to each portable in use. Each TDM packet that is transmitted by the port in any one TDM time slot contains 180 bits. Of these bits, the first sixteen bits contain a pre-defined framing synchronization pattern, the next three bits are dummy bits, followed by 161 bits in which the first 147 bits contained therein hold data and the last 14 bits hold a parity sequence. Unfortunately, different propagation delays between the port and its associated portables and timing differences, the latter resulting from clock jitter occurring between the port and these portables, will both occur. Hence, to prevent different TDMA bursts that are transmitted from different portables from overlapping in time, a guard time having a 16 bit duration is used in lieu of the frame synchronization pattern in each TDMA burst transmitted by a portable to the port. The transmitter in the portable remains off during this guard time. Accordingly, each TDM packet transmitted from the port to a portable contains 180 bits with a self-contained synchronization pattern; while each TDMA burst transmitted from a portable to the port contains only 164 bits and no synchronization pattern.

Although TDMA has been successfully used for quite some time in fixed microwave satellite communications, the use of TDMA in the art of low power portable digital telephony is quite new. In general, the art has traditionally shunned the use of TDMA in such single user applications for a variety of reasons, one of which being the complexity inherent in controlling a TDMA channel.

In this regard, one crucial function required in TDMA for use in low power telephony is the need to achieve synchronization between a port and its associated portables. In particular, three levels of synchronization are needed: frame, burst and symbol synchronization. Frame synchronization is necessary for a portable to determine the start of a frame and the occurrence of its currently assigned TDM/TDMA channel therein. Frame synchronization is achieved in a portable by having the port continuously transmit in a TDM mode during which a known framing sequence, including "idle" information in idle TDM channels, would be transmitted at a known time relative to the start of each frame. The portable would extract frame timing of its associated port by using a digital correlator to reset a frame counter whenever the framing sequence was received. Once frame timing is determined, the portable would then expect to receive each of two individual successively occurring TDM packets arriving within a designated time window that is sufficiently wide to allow for slippage due to frequency drift. Symbol synchronization is needed to determine the start of a data symbol situated within any transmitted TDM packet or TDMA burst. Symbol synchronization can be achieved within either a port or portable by using a timing reference that is estimated from received data. As such, no need exists to transmit any special symbol synchronizing signal. Burst synchronization is necessary to ensure that a portable is able to discern when it should transmit a TDMA burst in response to a TDM packet received from the port and that both the port and portable are able to discern which specific bit in each received TDMA burst or TDM packet, respectively, is the first bit therein. Unfortunately, each TDM packet transmitted from a port to an associated portable is subject to timing misalignment. In the portable, this misalignment can arise from frequency drift. Burst misalignment can arise in a port from the different propagation time delays associated with the portables transmitting to that port, frequency drift of local oscillators and reference oscillator error in a port receiver. Burst misalignment can be large after an outage. Due to the need to detect and properly compensate for bit slippage arising from misaligned bursts or packets, burst and packet synchronization is difficult and complex to achieve and maintain over a sufficiently wide range of slippage.

Traditionally, the art teaches that synchronization and error detection should be handled separately using circuitry specifically designed for each task. Although this approach is flexible, it tends to waste bits and is complex.

Conventionally, synchronization is commonly performed by, for example, appending a known bit pattern, such as a "Barker" code, to each burst before its transmission. See, specifically R. A. Scholtz, "Frame Synchronization Techniques", *IEEE Transactions on Communications*, Vol. COM-28, No. 8, August 1980, pages 1204-1213; and generally with respect to achieving synchronization through use of CRC codes W. W. Peterson et al, *Error-Correcting Codes (Second Edition)* (©1972, The MIT Press, Cambridge, Mass.—hereinafter referred to as the Peterson et al textbook) and specifically Chapter 12 "Synchronization of Block Codes" on pages 374-391 thereof, and J. J. Stiffler, *Theory of Synchronous Communication,* (©1971, Prentice Hall Pub. Co., Englewood Cliffs, N.J.—hereinafter referred to as the Stiffler textbook) and specifically Chapter 14 "Synchronizable Error-Correcting Codes" on pages 453-511 thereof. This pattern would be detected, typically through correlation, in a receiver which would then synchronize its operation thereto. To provide a sufficiently low probability of acquiring false synchronization (commonly and hereinafter referred to as "falsing"), the known bit pattern itself would typically need to be at least 11 bits long with additional bits being required in the burst or packet for error control coding. Unfortunately using sequences of this length is only efficient with rather large bursts or packets, typically in excess of 1000 bits. With continuous rather than burst transmission, re-synchronization only needs to occur over relatively long bit times and on-going synchronization overhead can be substantially reduced, such as by periodically "stealing" one data bit, such as occurs with T1 channels, to maintain synchronization during these bit times.

Unfortunately, this conventional approach to achieving synchronization is simply not suited for use with low power digital portable telephony. In particular, low power digital portable telephony does not use continuous transmission from portables to a port but rather bursts that each contains fewer than 200 bits. In addition, synchronization must occur quite often: every time a new call is placed or handoff occurs; and for robustness, every time a portable comes out of a "fading" swell. As such, with the conventional approaches, a synchronization pattern would need to be added to each burst whenever re-synchronization was needed. Since the need could arise at any time, such a pattern would need to be added to every burst. While the sixteen bits transmitted from the port to a portable in each 180 bit burst contain a sixteen bit synchronization pattern; each 164 bit burst transmitted from the portable to the port contains no such pattern. Instead, as noted above, the sixteen bits are used not as conventional synchronization bits but rather as a guard time to accommodate burst misalignment due to timing and clock jitter, and propagation delays, and to accommodate as much as a twelve bit delay time required both by the portable to turn off its transmitter and for the transmitter in the portable using the next successive demand-assigned TDMA channel to turn on. As such, if a sixteen bit synchronization pattern were to be embedded within each 164 bit burst, then this would severely decrease the available informational bit rate between a portable and the port and hence unduly limit the amount of data that could be transmitted from each portable to the port. Accordingly, using the conventional approach would simply not be acceptable here.

Apart from synchronization, a second crucial function needed in TDMA is error detection: the ability of both a port and a portable to reliably determine whether the bit stream in any received TDM packet or TDMA burst contains an erroneous bit. Bits are frequently corrupted through interference and/or noise. If an erroneous bit occurs, then the packet or burst containing that bit needs to be blanked.

Error detection is conventionally achieved by adding one or more parity bits to each data word to form a codeword. In its simplest form, parity takes the form of one bit that represents odd/even parity. In sophisticated forms, multiple parity bits are used to store a cyclical redundancy code (CRC). Certain CRC codes have the desirable property that if only one bit in a data word is changed, then the code would change dramatically such that two simple compensating bit errors in the data word could not turn one codeword into another. This advantageously allows a receiver to detect the occurrence of an error condition in which a certain number of bits occurring randomly throughout the data word erroneously and simultaneously change. If additional bit errors occurred, then through use of a CRC code, the existence of these errors could still be detected with a given probability related to two exponentiated by the number of parity bits that form the CRC code. In this regard, see section 8.8 "Error Detection with Cyclic Codes" on pages 228-230 of the Peterson et al textbook.

It has been known in the art for some time that CRC codes could be used in the absence of bit errors to perform synchronization occurring up to a slippage of one less than half of the number of parity bits. This would be accomplished by inverting the first and last bit in the CRC code thereby forming so-called "marker bits". See, e.g., section 12.1 "Codes That Recover Synchronization Only" on pages 376-381 of the Peterson et al textbook. While, at first blush, use of such a CRC code to achieve synchronization would seem useful since the port and portable transmit TDM packets or TDMA bursts that, through slippage, are related in time. Unfortunately using such a CRC code is problematical. First, incorporating such a CRC only for synchronization into the 164-bit burst transmitted by each portable would reduce the informational bit rate that could be carried within each transmitted burst from a portable to the port and thereby wastes spectrum. Second and most important, use of such a code to extract synchronization requires that a nearly, if not completely, error free string of bits be received for each burst to ensure that falsing will not occur. As such, a TDMA channel that carries this burst must be error-free. Such a condition can not be satisfied. Accordingly, using such a CRC code only to recover synchronization is unsuitable for TDMA burst processing in low power portable digital telephony because of the high falsing rate that would likely occur.

Moreover, a number of schemes for performing combined synchronization and error detection/error correction has been developed in the art, as are also specifically discussed in the above-cited chapter 12, specifically section 12.3 therein entitled "Codes that Recover Synchronization and Correct Additive Errors" on pages 386-390 thereof, and chapter 14 respectively of the Peterson et al and Stiffler textbooks. However, each of these schemes requires the inclusion of many more bits in a codeword than would otherwise be needed for separate error correction and error detection procedures and thus also tends to waste spectrum. Any reduction in the number of these bits would disadvantageously reduce the amount of bit slippage over which synchronization could be achieved and/or the number of bits that could be corrected.

With these teachings in mind and given the importance of performing re-synchronization and error detection for each transmitted burst through error-prone channels in low power digital telephony and the limitations inherent in the approaches taught in the art, the art appears to conclude that two separate bit patterns should be included within each TDMA burst, one pattern being pre-defined for synchronization and the other being a CRC for error detection, even though this approach wastes spectrum. The importance of performing these tasks separately apparently outweighs a concomitant reduction in transmission bit rate from a portable to the port as well as implementation complexity and added cost for each portable.

Thus, a specific need exists in the art for a relatively simple technique for jointly and inexpensively performing bit synchronization and error detection on a TDMA burst of received digital data. Such a technique should utilize fewer bits than that used heretofore in the art and conserve available transmission spectrum. As such, such a technique would advantageously find use both in facilitating the use of TDMA and in assuring that TDMA will provide very acceptable performance within a relatively inexpensive low power portable digital radio communication system.

SUMMARY OF THE INVENTION

Through our inventive technique, we have advantageously eliminated the deficiencies associated with the techniques disclosed in the art for achieving synchronization and error detection of received bursts, particularly TDMA bursts, of digital data, such as that which would illustratively occur in a low power TDM/TDMA communication system. Advantageously, our technique jointly and effectively provides both synchronization and error detection in an implementationally simple and inexpensive manner. In essence, our technique relies on successive addition and deletion of marker bits from a received word coupled with successive polynomial division in a two-pass approach using a common generator polynomial to successively determine timing and error syndrome values for this word.

Specifically, a cyclically redundant codeword that contains a pre-defined number of information bits, followed by a pre-defined number of parity bits, e.g. a (161,147) codeword, is formed for transmission, using e.g. either a TDM packet or TDMA burst for carriage over an error-prone radio link. The parity bits are determined by dividing the information bits by a given binary generator polynomial, $g(x)$. The first and last bits in the codeword are then marked through bit inversion thereof to yield a first set of marker bits.

The resulting codeword is then transmitted to a receiving site. At the receiving site, a two-pass approach is undertaken to recover synchronization of a corresponding received word and to determine whether any bit errors exist therein. Specifically, within the synchronization pass, a second set of marker bits is first inserted into the received word, again through inverting the first and last bits therein. The resulting marked word can then be rotated to the left by a pre-determined number, such as seven, of bit positions to place potentially erroneous bits at the end of this word. A multi-bit timing syndrome value is then determined for the resulting, now rotated, marked word, by dividing this word by the polynomial generator $g(x)$. The timing syndrome value is then used, for example, to access a look-up table to yield a corresponding value of bit slippage. The received word is then shifted, i.e. advanced or retarded, by an amount of bit positions and in a direction specified by the bit slippage value to yield an intermediate word. If excessive bit slippage has occurred in the received word, this slippage can not be corrected. As such, a suitable error signal is provided to instruct a receiver burst processor to ignore this word. At this point, an error detection pass is undertaken on the intermediate word. Within this pass, the first set of marker bits is first removed from the intermediate word to form an unmarked word for which an error syndrome value is then determined through polynomial division of this latter word by the polynomial generator $g(x)$. In the event the error syndrome value is zero, then the unmarked word is provided as a synchronized substantially error-free codeword to a suitable output point, such as a memory location or output lead. Alternatively, if the unmarked word contains one or more bit errors as indicated by a non-zero valued error syndrome, an error signal is also provided to a receiver burst processor to instruct it to ignore this word.

In accordance with the specific teachings of the preferred embodiments of our inventive technique, a (161,147) cyclically redundant codeword is preferably used with the generator polynomial $g(x)$ being $x^{14}+x^{11}+x^5+x^4+x^3+x^2+1$.

In accordance with a feature of our inventive technique, a secondary clock, which is established by a frame counter operating within a software phase locked loop in the portable, could advantageously eliminate the need for the port to transmit the pre-defined 16-bit synchronization code with every TDM packet. Specifically, the portable uses a pre-defined 16-bit synchronization pattern transmitted with every TDM packet by the port to obtain synchronization only under various conditions, e.g. when a portable first places a call through a TDMA channel, when handoff occurs and every time the portable comes out of a "fading" swell. Upon obtaining synchronization, the portable could transmit a suitable signal to the port. Accordingly, the port would cease transmitting the 16 bit synchronization pattern and allocate these bits to carrying other information. If the portable subsequently lost synchronization and so informed the port or the portable failed to respond to a port transmission within a given timeout interval, indicative of the likely occurrence of a "gross" synchronization error, then software executing in the port could appropriately insert the synchronization pattern back into the TDM packets transmitted by the port to that portable so as to allow the software phase locked loop executing within the portable to again attain phase lock and thereafter maintain synchronization of subsequently received TDM packets.

BRIEF DESCRIPTION OF THE DRAWINGS

The teachings of the present invention can be readily understood by considering the following detailed description in conjunction with the accompanying drawings, in which:

FIG. 1 is an overall diagram of low power TDM/TDMA portable digital telephony system 5 that incorporates the teachings of the present invention;

FIG. 2A is a timing diagram that depicts the frame and channel structure of port-to-portable communication occurring in system 5 for speech encoded at 16 kbits/second;

FIG. 2B is a timing diagram that depicts the frame and channel structure of portable-to-port communication occurring in system 5 for speech encoded at 16 kbits/second;

FIG. 6 depicts a table that provides synchronization estimation values for corresponding timing syndrome values;

FIGS. 12A and 12B collectively depict a high level flowchart of Portable Synchronization and Error Detection Interrupt Routine 1200 that is also executed on an interrupt basis by microprocessor 950 located within portable 34 as shown in FIG. 9.

To facilitate understanding, identical reference numerals have been used, where possible, to designate identical elements that are common to the figures.

DETAILED DESCRIPTION

Figure 3:
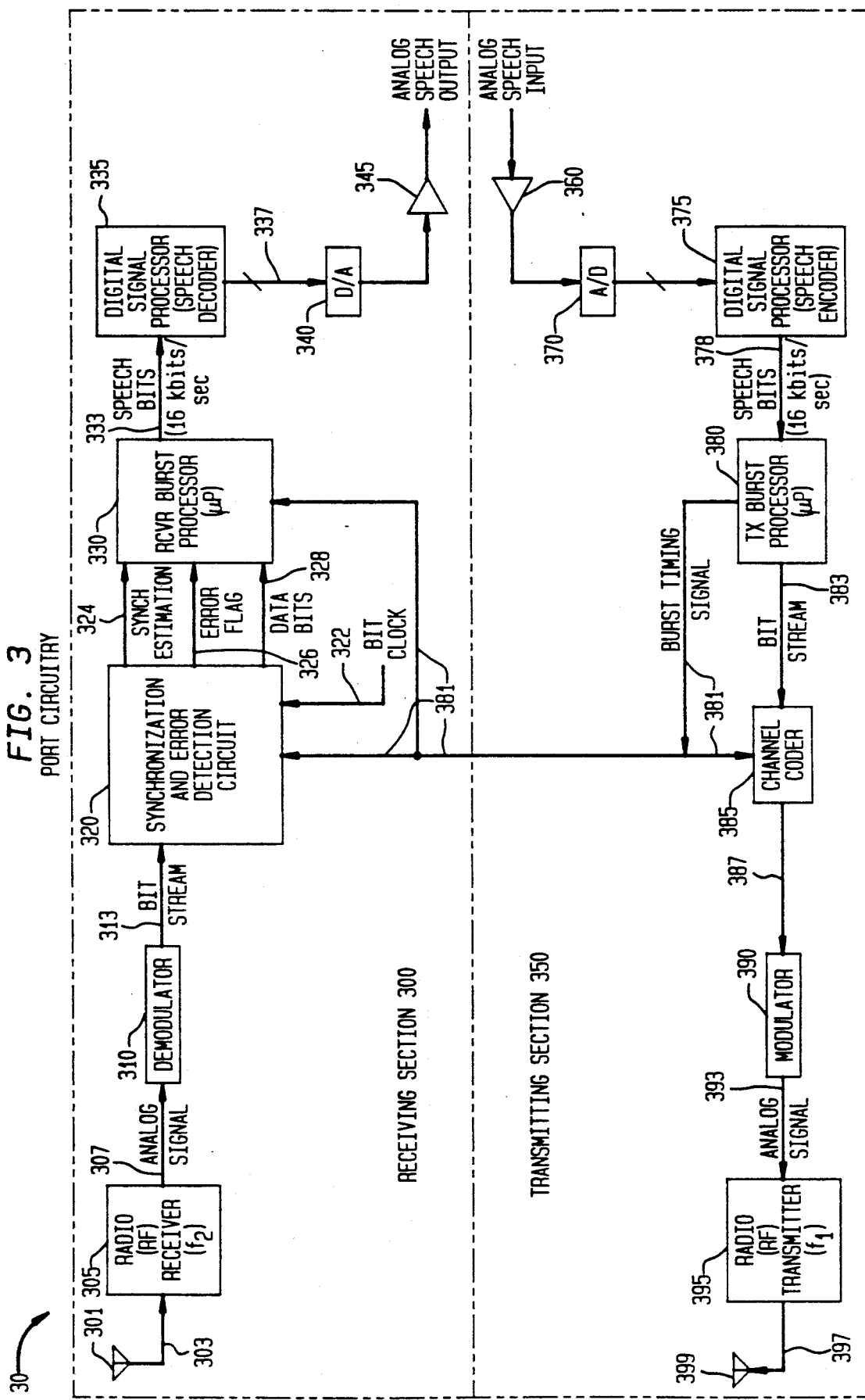
FIG. 3 depicts a simplified block diagram of the circuitry used to implement illustrative port 30 in system 5 shown in FIG. 1.

After considering the following description, those skilled in the art will clearly realize that the teachings of our inventive technique can be readily used to provide both bit synchronization and error detection in received bursts, e.g. TDMA bursts or TDM packets, of digital data that occur in substantially any communication system that relies on transmitting these bursts through a imperfect communication channel, such as that which typically and illustratively occurs in TDM/TDMA radio communication, wherein various bursts would experience bit error(s) and/or synchronization slippage over one or more bits. To simplify the discussion, our inventive technique will be discussed in the context of use within a system that provides low power portable digital telephony.

An overall diagram of low power portable TDM/TDMA digital telephony system 5 that incorporates the teachings of the present invention is shown in FIG. 1. Low power digital portable telephony utilizes a fixed base unit (hereinafter referred to as a "port") and a number of mobile transceivers (each of which is hereinafter referred to as a "portable"). Through use of time division multiple access (TDMA), each portable can access the port through a separate demand-assigned TDMA channel to carry duplex communication on a time division multiplexed (TDM) basis therebetween. The power used by the transmitter in each portable would range between 5–10 milliwatts or less on average and provide a range of several hundred to a thousand feet between a port and each of its portables. To accommodate a relatively large service area, several ports are used with individual calls being successively handed off from port to port as their corresponding callers carry their portables from the service area associated with one port to that of an adjacent port. An appropriate switch (not shown) which is located within a local central end office is suitably programmed to operate in a similar manner as does a mobile telephone switching office in order to controllably handoff calls from port to port as the callers transit corresponding local service areas associated therewith.

Specifically, system 5 contains four ports 30, 40, 50 and 70 and respective portables 34 and 36; 42, 44, 46 and 48; 52, 54, 56 and 58; and 72, 74 and 76. The ports themselves are connected to the switch located within central office 10 to provide access to a wireline telephone network. This connection can typically occur in one of two ways: either through copper digital lines 16 and 18 for illustratively ports 70 and 50, respectively, or via intermediary copper digital lines 23 and 27 to remote electronics 20 and 25 for illustratively ports 30 and 40, respectively. The remote electronics contain fixed distribution and concentration facilities for multiplexing traffic, in addition to that provided by ports 30 and 40, onto fiber feeders 12 and 14 which, in turn, feed central office 10. The switch located within the central office is connected, through trunk 7, to the wireline telephone network.

Each port would transmit time division multiplexed (TDM) bit streams on a pre-defined carrier frequency using quadrature phase shift keying (QPSK) modulation, with an inter-carrier spacing of 150 to 300 KHz and within a given operating frequency band situated somewhere between approximately 0.5 to 5 GHz. With this transmission range, a port could simultaneously serve as many as typically 20 separate locally situated portables that each carries digitized speech at a bit rate of 16 kbits/second. Here, ports 30, 40, 50 and 70 respectively serve portables 34 and 36; 42, 44, 46 and 48; 52, 54, 56 and 58; and 72, 74 and 76. The same TDM channels would be re-used at different ports that are spaced sufficiently far apart, such as ports 30 and 70, to reduce co-channel interference to an acceptably low level but yet conserve valuable spectrum. However, adjacent ports would be situated sufficiently close together in order provide an appropriate degree of overlap of their respective service areas thereby ensuring that no loss of coverage occurs during call handoff. Furthermore, each port utilizes a suitable antenna, such as antenna 31 for port 30, to carry its TDM transmissions to its associated portables and receive TDMA bursts therefrom. Given the carrier frequencies being used, each of these antennas is relatively small and suitable for mounting on a utility or light pole.

Inasmuch as system 5 replaces local copper drops and telephone cords with short range low power radio links, ambulatory callers are provided with completely tetherless access. Accordingly, through radio links 33 and 38, illustrative callers 35 and 37 located within respective residences 63 and 67 are completely free to move within the entire service area provided by system 5, i.e. that provided by ports 30, 40, 50 and 70, while advantageously maintaining continuity of their existing telephone conversations as well as being able to place calls through other ("non-home") ports as their travel progresses.

Each port continuously transmits on a TDM basis, while portables transmit in bursts on a TDMA basis to their associated port. Two different carrier frequencies are used to carry communication between each port and a portable: one frequency, frequency $f_1$ for port 30, to carry communication from that port to each of its portables and another frequency, frequency $f_2$ for port 30, to carry communication from each of these portables to this port. Although adjacent ports used different pairs of frequencies, these carrier frequencies are also re-used for ports that are spaced sufficiently far apart from each other to conserve spectrum. The spacing is appropriately set to ensure that co-channel interference that might occur at any port will remain at an acceptably low level.

FIG. 2A is a timing diagram that depicts the frame and channel structure of port-to-portable communication occurring in system 5 for speech encoded at a rate of 16 kbits/second. The port continually transmits frames 200 of TDM time slots at a periodicity of every 16 milliseconds over carrier frequency $f_1$. Each time slot contains a 180-bit TDM packet, such as TDM packet 230 (burst 0) in time slot 213 or TDM packet 240 (burst 1) in time slot 217. To carry digitized encoded speech at a rate of 16 kbits/second, two contiguous time slots, e.g. slots 213 and 217, are assigned to form one TDM channel, e.g. channel 220. Each packet carries information using a (161,147) codeword in which 147 bits are information bits with the following 14 parity tits carrying a CRC code. Specifically, each TDM packet transmitted by the port contains four fields: sixteen-bit synchronization field 232 in bit positions 0 through 15, dummy bit field 234 in bit positions 16 through 18, 147-bit information field 236 in bit positions 19 through 165 and fourteen-bit CRC parity bit field 238 in bit positions 166 through 179. Synchronization field 232 carries a pre-defined sixteen bit synchronization pattern. This pattern defines the beginning of a TDM packet and also indicates to a portable that a next successive TDM packet for this particular TDM channel will occur one frame interval later. As noted below, this pattern is only used within the portable to initially establish synchronization for this TDM channel and is not used thereafter in favor of our inventive technique. Dummy bit field 234 contains three bits. One of the dummy bits (not specifically shown) is added to the length of the following codeword such that the resulting codeword can be encoded using an even number of symbols for eventual transmission by QPSK modulation. The other two dummy bits (also not specifically shown) are used to initialize a differential symbol decoder (also not shown) contained within a QPSK demodulator located in the receiver of a portable.

Rather than transmitting continuously as with the port, each of the portables that is associated with a port transmits a burst of bits, i.e. a TDMA burst, during an appropriate window of time to that port. However, to accommodate burst misalignment due to timing and clock jitter, and propagation delays, and to accommodate as much as a twelve bit delay time required both by the portable to turn off its transmitter and for the transmitter in the portable using the next successive demand-assigned TDMA channel to turn on, the sixteen synchronization bits that form part of any TDM packet transmitted by the port are instead used as guard time within each TDMA burst transmitted by a portable and thereby establish a time window. Accordingly, no information is transmitted by the portables during any guard time. For ease of reference, both TDM packets and TDMA bursts hereinafter will be collectively referred to as "bursts", unless specific reference is made to either a TDMA burst or a TDM packet.

Specifically, FIG. 2B is a timing diagram that depicts the frame and channel structure of portable-to-port communication occurring in system 5 for speech encoded at a rate of 16 kbits/second. TDMA frames 250 are transmitted over carrier frequency $f_2$ also at a periodicity of every 16 milliseconds to match that of the port. Each time slot transmitted by a portable contains a 164-bit burst, such as burst 280 (burst 0) in time slot 263 or burst 290 (burst 1) in time slot 267. Each burst within any one TDMA frame is transmitted by a different portable. Within any group of portables served by one port, each portable transmits a burst in a different TDMA time slot within a TDMA frame such that all the portables transmit in a round robin fashion to produce this frame.

Again, to carry digitized encoded speech at a rate of 16 kbits/second, two contiguous time slots, e.g. slots 263 and 267, are assigned to form one TDMA channel, e.g. channel 270. As in the port transmissions, each burst transmitted by the portable carries information using a (161,147) codeword in which 147 bits are information bits with the following 14 parity bits carrying a CRC code. However, each TDMA burst that is transmitted by a portable only contains three fields: dummy bit field 284 in bit positions 0 through 2, 147-bit information field 286 in bit positions 3 through 149 and fourteen-bit CRC parity bit field 288 in bit positions 150 through 163. Guard time 282 occupies the corresponding time interval that in port transmissions contained a synchronization field. Corresponding TDM and TDMA channels are generally offset in time from each other, such as by a time interval of "J" time slots as shown in FIG. 2B, to compensate for processing delays and the like.

It is this lack of a synchronization field in each burst transmitted by a portable that directly gives rise to the need for our invention. In particular, owing to the bursty nature of the TDMA communication itself, the existence of new calls and handoff occurring between ports and "fading" swells, noise and interference that will likely be experienced on a low power radio link, re-synchronization and error detection must occur on every burst received over the low power radio link. Accordingly, given the limitations in the art for achieving re-synchronization and error detection over such links, the art appears to teach that separate techniques for achieving re-synchronization and error detection should be used, i.e. a separate pre-defined synchronization sequence and a CRC (cyclic redundancy code) for error detection should be embedded within each transmitted burst and separate re-synchronization and error detection processes should then be undertaken in the receivers in both the port and particularly in the portable. Even though this approach severely restricts the informational bit rate that can be carried in each TDMA burst transmitted by a portable and thus wastes valuable spectrum and is also complex and expensive to implement, the art nevertheless teaches that this approach must be followed if one skilled in the art is to achieve satisfactory re-synchronization and error detection of TDMA bursts appearing over error-prone channels in low power portable digital telephony.

In accordance with the teachings of our invention, we have advantageously determined that it is not necessary to include separate synchronization and error detecting sequences in a TDMA burst in order to achieve very acceptable levels of re-synchronization and error detection. Rather, through our inventive technique, a received word modified by the successive addition and deletion of marker bits coupled with successive polynomial division using a common generator polynomial can provide both synchronization recovery and error detection for this word. Specifically, marker bits are first appended to each codeword prior to its transmission by either a port or portable. Within a corresponding receiver, each of the received words is successively processed in a two pass approach to provide both re-synchronization and error detection.

In particular, to recover synchronization, our invention utilizes the well-known property of cyclic codes that any cyclic shift of a codeword produced by a cyclic code still produces a codeword. In general, a cyclic code of code-length n can be specified by its generator polynomial $g(x)$, where $g(x)$ divides into $x^n - 1$. The degree of $g(x)$ equals the number of redundant bits in the code. An information bit sequence of length k can be considered as a polynomial $i(x)$ with degree at most $k-1$. The encoding process is accomplished by dividing $i(x) \cdot x^{n-k}$ by $g(x)$ to yield remainder $R(x)$ and then appending the remainder to the end of $i(x)$ to yield codeword $A(x)$, i.e. codeword $A(x) = i(x) \cdot x^{n-k} + R(x)$.

As noted through our inventive technique, a sequence of information bits is first encoded into a suitable codeword, A, prior to its transmission with the first and last bits of the codeword being inverted to form a first set of marker bits, $M_1$. The resulting transmitted word, T, equals $A + M_1$. We have illustratively chosen to use a (161,147) CRC code in which the codeword contains 161 bits, the first 147 of which are information bits followed by a 14 parity bit sequence. Use of this particular code with 14 parity bits correctly provides synchronization recovery for bit slippages of up to $\pm 6$ bits on an error-free channel.

Within each receiver, in both the port or portable, a two-pass process is undertaken first to recover synchronization and second to perform error detection on each received word R. Under error-free conditions and with no bit slippage, received word R equals a corresponding transmitted word T. However, under normal TDM/TDMA transmission conditions, received word R from time to time might be offset from transmitted codeword T and/or contain one or more bit errors, thereby necessitating synchronization recovery and error detection of received word R. Specifically, to begin the first pass, a second set of markers, $M_2$, is added to the received word, R, to produce a word, X, such that $X = R + M_2$. Once word X is produced, this word is then rotated, typically 7 bits to the left. The resulting rotated word is then divided by $g(x)$ to yield a timing syndrome value, typically having fourteen bits. If the value of the timing syndrome is zero, then the received word has proper synchronization. In the event the timing syndrome is non-zero, channel errors and/or timing offset exists. During the first pass, the timing syndrome value is used as an address to access a look-up table of pre-defined timing syndrome values to yield a corresponding burst timing offset value (synch bit slippage). If the timing syndrome value does not match one of the pre-defined values, thereby indicating excessive bit slippage exists, an error flag is set to "one" which causes the received word to be dropped. Alternatively, if the timing syndrome value matches any of the pre-defined values, then received word R is shifted, i.e. advanced or retarded, by an amount of bit positions and in a direction indicated by the corresponding offset value to yield intermediate word Y. Intermediate word Y is then subjected to an error detection pass. Specifically, within this second pass, the first set of marker bits is first subtracted from the intermediate word with the resulting unmarked word then being divided by $g(x)$ to yield an error syndrome value, typically having 14 bits. If the error syndrome is zero-valued, then this unmarked word, which is also properly synchronized, has substantially no errors and is a codeword. Accordingly, the error flag is reset to "zero" which, in turn, causes the unmarked word to be accepted by downstream circuitry in the receiver. Alternatively, if the error syndrome is non-zero, thereby indicating that the unmarked word contains one or more bit errors, then the error flag is set to one, which, in turn, causes the unmarked word to be dropped.

The description will now discuss the specific implementations of our technique in both the port and each portable. Since the port must process each successively received TDMA burst in a TDMA frame, and specifically process each such incoming burst within a single time slot, we have implemented our inventive technique in the port through dedicated hardware circuitry, as described in detail below, to provide relatively fast processing. However, only two successive incoming TDM packets within any TDM frame are destined for and need to be processed by each portable during any frame. Since excess processing time is available in the portable, we have implemented our inventive technique in each portable using multiplexed $g(x)$ division hardware driven by appropriate software executing within a microprocessor, also described in detail below. Inasmuch as the tasks of performing TDM/TDMA channel and TDM/TDMA time slot assignment by the port, time slot recognition in the portable and call handoff between separate ports along with the associated hardware and software for performing these tasks do not form part of our present invention, these tasks will not be discussed hereinafter in any significant detail. Moreover, to simplify the drawings, all of these tasks have been omitted therefrom. A. Port Implementation FIG. 3 depicts a simplified block diagram of the circuitry used to implement illustrative port 30 in system 5 shown in FIG. 1.

As shown, port 30 contains receiving section 300 and transmitting section 350. In essence, receiving section 300 receives each TDMA burst transmitted by a portable, demodulates that TDMA burst, and performs synchronization and error detection on the demodulated burst to yield a data burst for that channel. The data burst for each channel is then converted into corresponding encoded speech at a bit rate of 16 kbits/second. The resulting digitized speech for each channel may then be demultiplexed, converted into analog form, amplified and applied to a suitable output terminal, as shown, or kept in multiplexed digital form for subsequent carriage over a digital facility.

Specifically, incoming TDMA bursts which impinge upon antenna 301 are, in turn, routed, via lead 303, to radio (RF) receiver 305 that is tuned to carrier frequency $f_2$. This receiver routes a received analog signal, via lead 307, to demodulator 310 which extracts therefrom digitized data that forms every TDMA burst. The demodulator operates using coherent QPSK demodulation with differential decoding. The bit stream for all such bursts produced by demodulator 310 and appearing on lead 313 are serially routed to synchronization and error detection circuit 320. Circuit 320, implemented in dedicated hardware and as discussed in detail below, performs synchronization recovery and error detection using our inventive technique on the bit stream that forms every demodulated burst. This circuit provides three outputs: a synch estimation (timing offset) value having a value equal to or less than ±6 bits on leads 324, an error flag on lead 326 and a stream of bits on lead 328 that form a codeword for each received TDMA burst. Inasmuch as the port transmitter is continuously transmitting on successive TDM time slots with the portables responding thereto, burst timing in the port receiving section is slaved to burst timing signals fabricated in the port transmitting section. Accordingly, circuit 320, in response to burst timing pulses occurring on lead 381 from transmitting burst processor 380, either advances or retards each demodulated bit in every TDMA burst, providing the slippage for that burst is within ±6 bits, such that the first bit in that burst substantially coincides with a burst timing pulse appearing on lead 381. The timing of circuit 320 is also controlled by a bit clock appearing on lead 322. Clearly, the circuits that form the port will likely have inherent processing delays and timing offsets that might delay and/or offset their outputs, such as that of circuit 320. Similar delays will exist within each portable. Inasmuch as these processing delays are well-known to those skilled in the art, then, for purposes of simplicity, these delays and offsets will hereinafter be assumed to be zero and will be ignored in the following discussion.

Receiver burst processor 330, which is implemented using a suitable microprocessor, converts only those codewords appearing on lead 328 that are synchronized and substantially error-free into 16 kbits/second encoded digital speech. Specifically, this burst processor uses the synch estimation value as a secondary clock to shift the synchronization window accordingly and thereby maintain local synchronization of the bit stream that forms each codeword. Inasmuch as receiver burst processor 330 will only process bit streams appearing on lead 328 that are associated with synchronized substantially error-free ("valid") codewords, then, if the error flag on lead 326 becomes high during the occurrence of any burst on lead 328, burst processor 330 will simply drop and effectively ignore the resulting word for that burst. For two successive words occurring during any one TDMA channel that are "valid", i.e. the error flag remained low throughout their occurrence, then the receiver burst processor converts the serial information in both of these words, as "valid" codewords, into a serial digital stream of 16 kbits/second encoded speech. A different stream is produced for each TDMA channel. Inasmuch as the receiver burst processor is a simple packet processor that operates in a well-known fashion, its operation will not be discussed in any further detail. The resulting serial bit stream produced by the receiver burst processor is fed, via lead 333, to digital signal processor 335 which appropriately decodes the speech and applies resulting decoded digital values in byte-wise parallel form to digital to analog (D/A) converter 340. The analog output provided by this converter is amplified, by amplifier 345, to a suitable level to provide analog speech at an appropriate output point if desired. Though not specifically shown, a separate digital signal processor, A/D converter and amplifier would exist for each available TDMA channel, be connected to a respective output of the receiver burst processor and would respond to the appropriate bit streams for that channel and supplied by that burst processor. Alternatively, converter 340 and amplifier 345, and even digital signal processor 335 could be eliminated if the received speech is to be subsequently carried in multiplexed digital form over a digital facility to the wireline network.

Transmitting section 350 accepts incoming speech for each channel from a wireline network connection and fabricates and continuously transmits outgoing TDM communication to all the portables associated with port 30. This speech can either be in analog form or in digital form.

Specifically, if incoming speech for transmission to a portable is in analog form, that speech is applied through amplifier 360 to analog-to-digital (A/D) converter 370 that produces a succession of correspondingly equivalent parallel digital values. These values are applied as input to digital signal processor 375 which suitably encodes these values into a serial stream of 16 kbits/second speech. Though not specifically shown, a separate amplifier, D/A converter and digital signal processor would exist for each available TDM channel and be connected to a respective input of the transmitter burst processor. Alternatively, if the incoming speech from a network connection is in multiplexed digital form, then amplifier 360, A/D converter 370 and even digital signal processor 375 may be eliminated. The 16 kbit/second digital bit stream appearing on lead 378 is then routed to an appropriate input on transmitter burst processor 380. This burst processor merely converts the encoded speech on each channel, of which twenty channels are carried on forty TDM time slots, into two successive corresponding 147-bit informational bit streams and also generates appropriate pulses as burst timing signals over lead 381. As such, transmitter burst processor 380 produces a succession of forty 147-bit TDM bit streams for each frame over lead 383. Inasmuch as the transmitter burst processor is also a simple packet processor that operates in a well-known fashion, its operation will not be discussed in any further detail.

All the informational bit streams generated by the transmitter burst processor are routed over lead 383 to channel coder 385. The channel coder calculates fourteen parity bits for each 147-bit informational bit stream using a given g(x) generator for a CRC code, as discussed in detail below, appends the resulting fourteen parity bits to that bit stream to form a codeword and modifies the resulting CRC codeword to include marker bits. The channel coder also inserts a pre-defined synchronization pattern followed by three dummy bits in each bit stream prior at the beginning of each codeword, as discussed above. The resulting bit streams form a serial stream of TDM packets which is applied, via lead 387, to modulator 390. The modulator modulates each of these packets using differentially encoded QPSK onto a carrier frequency. A resulting analog signal appearing over lead 393 is applied to radio (RF) transmitter 395 for transmission over carrier frequency $f_1$, via lead 397 and antenna 399, to the portables associated with port 30, specifically portables 34 and 36 shown in FIG. 1.

Figure 4:
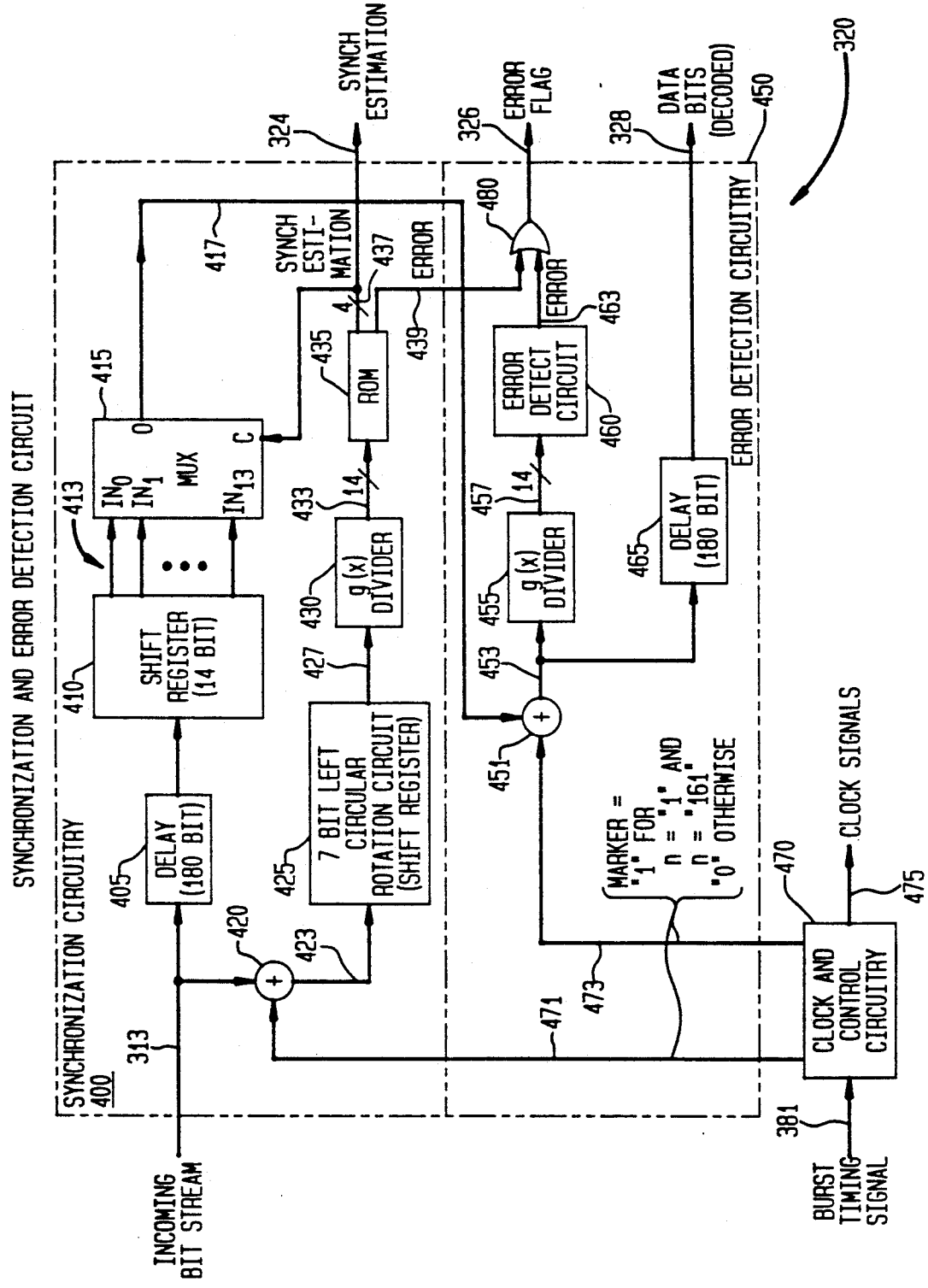
FIG. 4 depicts a block diagram of synchronization and error detection circuit 320 that forms part of port 30 shown in FIG. 3.

FIG. 4 depicts a block diagram of synchronization and error detection circuit 320 that forms part of port 30 shown in FIG. 3. This circuit implements our inventive joint synchronization and error detection technique in dedicated hardware circuitry. The circuitry is operated in a pipelined fashion such that while error detection is being performed on one TDMA burst, synchronization can be performed on the next such burst. This permits continuous channel decoding with circuitry 320 being clocked at the bit rate. Circuit 320 is formed of synchronization circuitry 400, error detection circuit 450, OR gate 480 and clock and control circuitry 470. Clock and control circuitry 470 produces appropriate clock signals that control the operations of all the other elements in circuit 320. To simplify this figure, those clock signals that are readily ascertainable to one skilled in the art have been omitted therefrom.

In particular, an incoming bit stream appearing on lead 313 is routed to synchronization circuitry 400 which attempts to recover correct synchronization therefrom. Within circuit 400, the bit stream is routed to delay 405 and to one input of adder 420. Delay 405, typically implemented with a suitable shift register, provides a 180-bit delay which is sufficient to store an incoming 164-bit TDMA bit stream with all possible synchronization positions while its timing syndrome is being determined. The timing syndrome is determined through adder 420, rotation circuit 425, g(x) divider 430 and read only memory (ROM) 435. Specifically, adder 420, which is implemented using a single Exclusive OR gate, inverts the first and 161st bit in the incoming bit stream, i.e. the received word, to insert a second set of marker bits at these two bit positions. To effectuate this, clock and control circuitry 470 applies a "1" value on lead 471 at the appropriate bit times. The second set of marker bits is only used for synchronization recovery. The output of adder 420 is routed over lead 423 to rotation circuit 425 which provides a 7 bit left rotation of the incoming word. The purpose of this 7-bit rotation is to place the first seven bits of the now marked received word at the least significant bit positions therein. These bits are likely to contain errors if a timing offset occurred. This rotation circuit can be easily implemented by using a 7-bit shift register which, under control of clocking and control circuitry 470, is appropriately filled in serial fashion with the first seven bits of the incoming word emanating from adder 420 and then serially emptied once the end of this word has been clocked through this adder. In any event, the serial output from rotation circuit 425 is applied in serial fashion over leads 427, to g(x) divider 430. As the data is shifted into the divider during successive clock pulses, the divider divides the 161-bit word by the following generator polynomial:

$$g(x) = x^{14} + x^{11} + x^4 + x^3 + x^2 + 1 \tag{1}$$

to yield a fourteen bit timing syndrome value in parallel form on leads 433. The timing syndrome is applied as an address to ROM 435. For each pre-defined timing syndrome value that is associated with a different burst timing offset (synch estimation) value between ±6 bits inclusive, the ROM stores the synch estimation value associated therewith, in four bit form, as well as a "zero" bit for the error flag. At all other addresses, the ROM merely stores a "one" bit for the error flag. A typical table stored in ROM 435 that provides synch estimation values for corresponding timing syndrome values is shown as table 610 in FIG. 6. The two delimiting "1" bits in each timing syndrome value are marker bits—one such bit resulting from the channel encoder in the portable and the other such bit resulting from adder 420 within synchronization and error detection circuit 320 in the port.

In the event the timing syndrome has a value that matches any of these pre-defined values (such as that provided in table 610), then the corresponding synch estimation value is applied by ROM 435 to leads 437 in parallel form, as shown in FIG. 4. As noted above, this synch estimation value specifies the amount of bit slippage that exists in the incoming received word, now stored in delay 405. Accordingly, to properly synchronize this received word, the synch estimation value is routed, via leads 437, to the control input of multiplexer 415. Thereafter, under the control of clock and control circuitry 470, the output of delay 405 is then clocked through shift register 410. The contents of shift register 410 are applied in parallel form, over leads 413, to multiplexer 415 which, based upon the synch estimation value appearing on leads 437, selects the proper tap on this shift register to advance or retard the bits forming the received word such that the resulting bit stream clocked through the multiplexer and appearing on lead 417 as an intermediate word has the correct synchronization. The synch estimation value is also applied, to leads 324, as an output from circuit 320. In the event the timing syndrome does not match any of the pre-defined values, then ROM 435 merely places a "1" bit on error lead 439. This lead forms one input to OR gate 480. In response to this high valued error bit, OR gate 480 places a high level as the error flag on lead 326 thereby indicating that the intermediate word on lead 417 has excessive bit slippage, can not be synchronized and therefore should be dropped.

Circuit 450 detects whether each intermediate word appearing on lead 417 contains one or more bit errors. Specifically, each word, whether synchronized or not, appearing over lead 417 is routed through adder 451. This adder, using a "1" value supplied over lead 473 at appropriate times by clock and control circuitry 475, removes the first set of marker bits that appear in the first and last bits in the intermediate word so as to form an unmarked word by inverting these bits in the intermediate word in much the same manner as does adder 420, as described above. The resulting unmarked word produced by this adder and appearing in serial form on lead 453 is routed to 180-bit delay 465. This delay saves this unmarked word while error detection is being performed thereon. In addition, the resulting unmarked word is also serially shifted into g(x) divider 455, which being identical to divider 430, divides the unmarked 161-bit word during successive clock pulses by the generator polynomial given by equation (1) above. Once the unmarked word has been shifted through divider 455, a fourteen bit syndrome value, hereinafter referred to as the error syndrome, appears in parallel form, via leads 457, and is applied to an input of error detect circuit 460. Bit errors will exist for any non-zero error syndrome. Hence, error detect circuit 460 merely determines, by simply "ORing" all the bits in the error syndrome together, whether any bit therein is "one". If any such bit is "one", then error detect circuit 460 produces a "1" value error bit on error lead 463 which is routed as another input to OR gate 480. In response to this high valued bit, OR gate 480 places a high level as the error flag on lead 326 thereby indicating that the unmarked word contains one or more erroneous bits and therefore should be dropped by port receiver burst processor 330 (see FIG. 3). Once error detection is performed, regardless of its results, clock and control circuitry 470, shown in FIG. 4, shifts the stored unmarked word from delay 465 as the decoded data bits appearing on leads 328. Alternatively, in the event that the error syndrome is zero-valued, then the level of the error flag on lead 326 remains low thereby signifying that the unmarked codeword appearing on leads 328 is synchronized and is expected to be substantially error-free and should be appropriately processed as a codeword by the port receiver burst processor.

Figure 5:
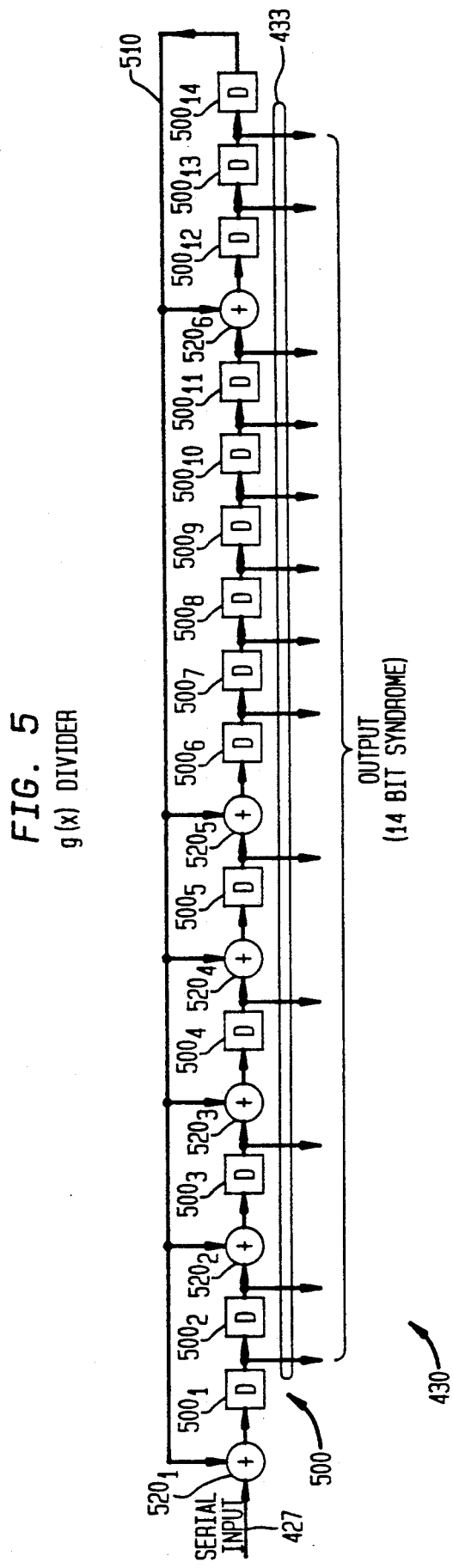
FIG. 5 depicts a block diagram of each illustrative g(x) divider, and specifically divider 430 shown in FIG. 4, that forms part of synchronization and error detection circuit 320 shown in FIG. 3.

FIG. 5 depicts a block diagram of divider 430 that forms part of synchronization and error detection circuit 320 shown in FIG. 3. As noted above, identical circuitry is used to implement g(x) divider 455 shown in FIG. 4. Specifically, as shown in FIG. 5, divider 430 is formed of shift register 500 having fourteen separate cells, specifically D type flip/flops $500_1$, $500_2$, ..., $500_{14}$; feedback path 510 and adders $520_1$, $520_2$, ... $520_6$. Each of these adders is implemented through a single Exclusive OR gate. In operation, the clocked output of shift register 500 is fed back over lead 510 to an input of each of the adders. The incoming serial bit stream appearing on lead 427 and the output of cells $500_2$, $500_3$, $500_4$, $500_5$, $500_{11}$ and $500_{14}$ are respectively applied as another input to each of adders $520_2$, $520_3$, $520_4$, $520_5$, $520_6$ and $520_1$ the output of which, in turn, respectively feeds the input of cells $500_3$, $500_4$, $500_6$, $500_{12}$ and $500_1$. Accordingly, after all the 161bits in a word have been shifted through g(x) divider 430, the output of this divider taken in 14-bit parallel form over leads 433 contains a syndrome value which equals the remainder of the polynomial division of an incoming word by the specific function for g(x) given by equation (1) above. For additional information regarding shift register implementations for polynomial division, the reader is referred to section 7.2 "Multiplication and Division of Polynomials" appearing on pages 171-178 of the Peterson et al textbook.

Figure 7:
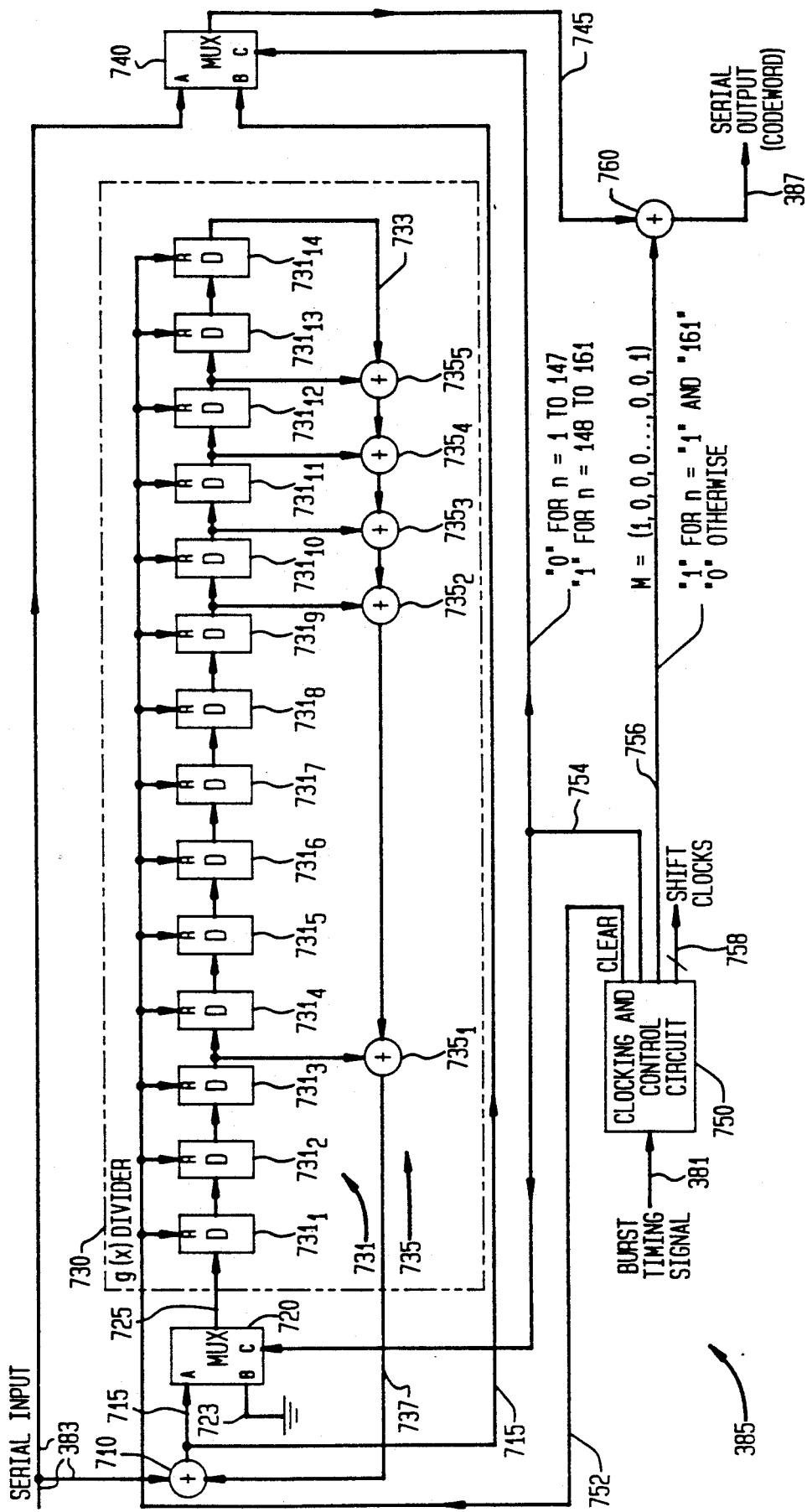
FIG. 7 depicts a block diagram of channel coder 385 that forms part of port 30 shown in FIG. 3.

FIG. 7 depicts a block diagram of channel coder 85 that forms part of port 30 shown in FIG. 3. The channel coder, as discussed above, calculates fourteen parity bits for each 147-bit informational bit stream for subsequent inclusion in a TDM bit stream using the g(x) generator specified by equation (1) for a (161,147) cyclic code, appends the resulting fourteen parity bits to that informational bit stream to form a cyclic codeword and modifies the resulting cyclic codeword to include the first set of marker bits. The channel coder also inserts a pre-defined sixteen bit synchronization pattern followed by three dummy bits in each TDM bit stream prior to the beginning of each codeword so as to form a resulting TDM packet. Inasmuch as the circuitry used within channel encoder 385 to synthesize and insert the synchronization pattern and three dummy bits at the beginning of each TDM bit stream is well-known in the art, then to simplify this figure, this circuitry has been omitted therefrom and will not be discussed herein.

Specifically, as shown, the channel coder contains adder 710, multiplexers 720 and 740, g(x) divider 730, adder 760 and clocking and control circuit 750. Incoming 147-bit information bit streams are serially applied over lead 383, from transmitter burst processor 380 (see FIG. 3) to one input of adder 710 and one input (input "A") of multiplexer 40. As shown in FIG. 7, the other input to this adder is the output of g(x) divider 730 that appears on lead 737. The output of this adder is applied to one input (input "A") of multiplexer 720 with the other input thereof (input "B") being grounded. The output of the multiplexer is applied to a data input of g(x) divider 730. The output of adder 710 is also routed, over lead 715, to a second input (input "B") of multiplexer 740. The output of multiplexer 740 is, in turn, routed via lead 745 to an input of adder 760. Clocking and control circuit 750, which provides a clear signal over lead 752 to g(x) divider 730, multiplexer control signals over lead 754, and various shift clock signals over leads 758, also provides a control signal as a second input to adder 760. Circuit 750 generates its clock and control signals based upon the occurrence of each pulse in the burst timing signal appearing on lead 381. The serial output of this adder appearing on lead 387 is the cyclically encoded codeword. g(x) divider 730 is also formed of a feedback shift register, here shift register 731 with adders 735 serially placed in feedback path 733. Shift register 731 contains fourteen serially connected cells, specifically D type flip/flops $731_1$, $731_2$, ... $731_{14}$. Adders 735, formed of individual adders $735_1$, $735_2$, $735_3$, $735_4$ and $735_5$, combine the outputs of cells $731_3$, $731_9$, $731_{10}$, $731_{11}$, $731_{12}$ and the clocked output of the shift register appearing on feedback path 733 to form the divided output bit stream. The reset input to all the cells is connected to clear lead 752.

In operation and immediately prior to the beginning of each incoming 147-bit informational bit stream appearing over leads 383, clocking and control circuit 750 provides a clear pulse to lead 752 to reset the contents of shift register 731 within g(x) divider 730 to "zero". Once this has occurred, an incoming 147-bit informational bit stream is serially applied via lead 383 to input A of multiplexer 740 and to one input of adder 710 and from the latter to input A of multiplexer 720. In order to calculate the syndrome, i.e. the resulting 14 parity bits, for this bit stream, clocking and control circuit 720 applies an appropriate low ("0") level to lead 754 to instruct multiplexer 720 to route the output of adder 710 through to lead 725 and hence into shift register 731 while all 147 bits in the informational bit stream are being serially clocked therein. Inasmuch as lead 754 also feeds the control input of multiplexer 740, then these informational bits, which are also being applied via leads 383 to the A input of multiplexer 740, are serially clocked through multiplexer 740 to adder 760. Once the entire informational bit stream has been clocked into g(x) divider 730, clocking and control circuitry 750 places a "1" level on lead 754 to instruct multiplexer 720 to ground the input of g(x) divider 730 and to instruct multiplexer 740 to route the output of adder 710 over lead 745 as an input to adder 760. During the next fourteen shift clock pulses, zero-valued bits will be shifted into shift register 731 with the resulting fourteen serially occurring bits appearing on lead 715 being the parity bits. These parity bits are appended by multiplexer 740 onto the end of the 147-bit informational bit stream to form a 161-bit cyclic codeword on lead 745. Coincident with the occurrence of the first and last (161st) bit in the resulting cyclic codeword appearing on lead 745, clocking and control circuit 750 applies a "1" bit to lead 765 which causes adder 760 to incorporate the first set of marker bits into the codeword by inverting the first and last bits in this codeword. The resulting marked codeword serially appears on lead 387.

Figure 8:
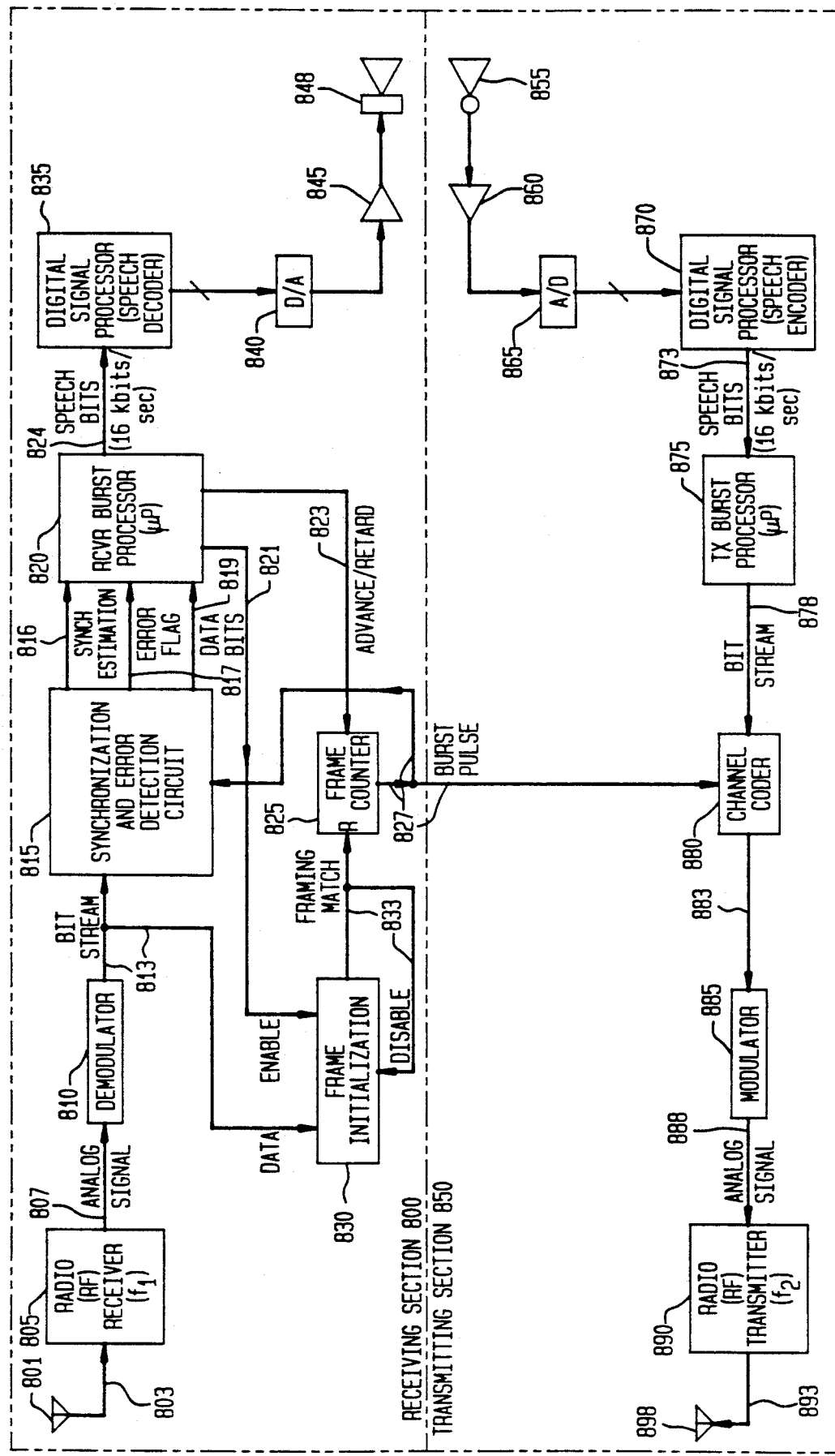
FIG. 8 depicts a functional block diagram of the operations performed within any portable, and specifically within illustrative portable 34 that forms part of system 5 shown in FIG. 1.
Figure 9:
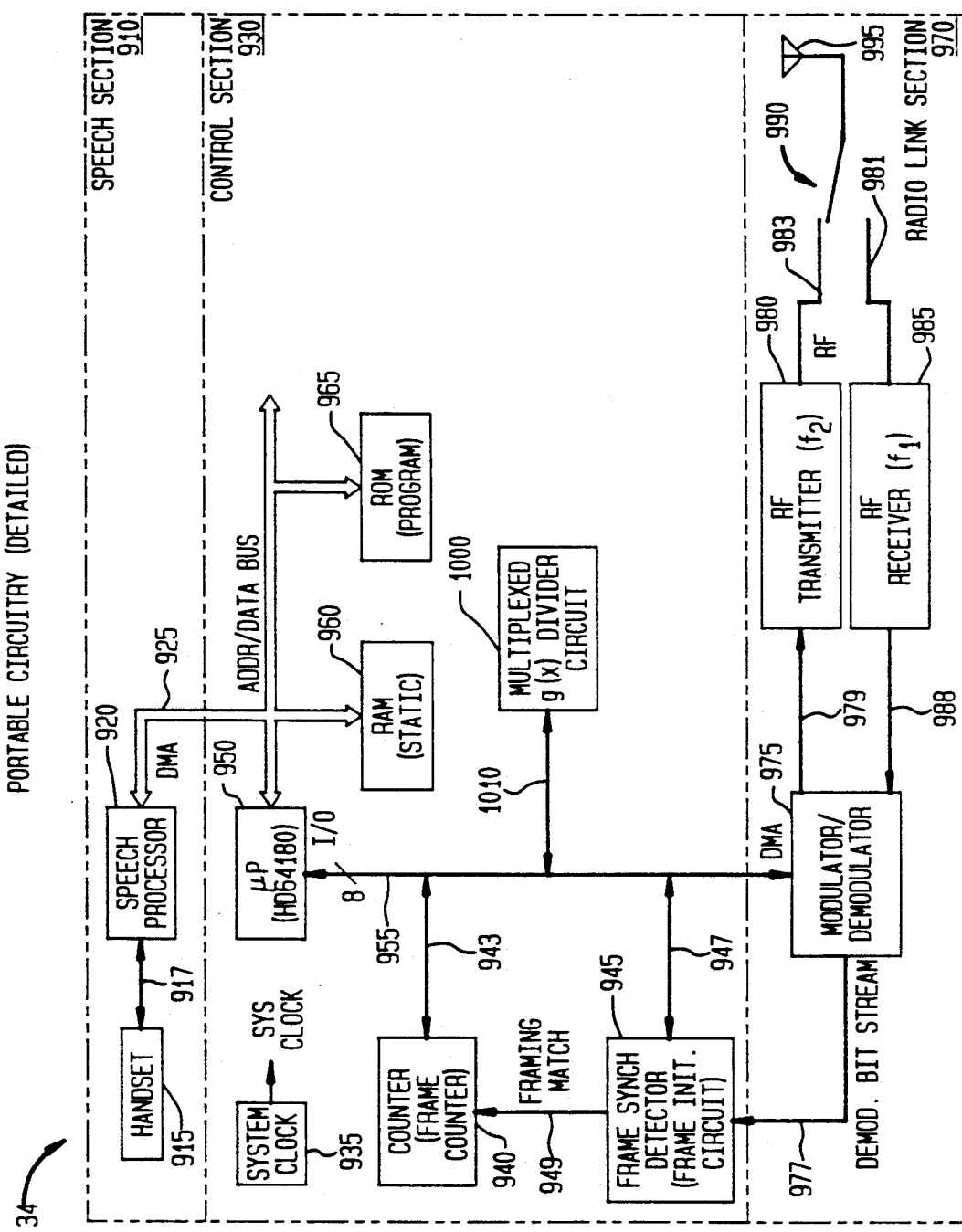
FIG. 9 is detailed block diagram of the circuitry used to implement portable 34.
Figure 10:
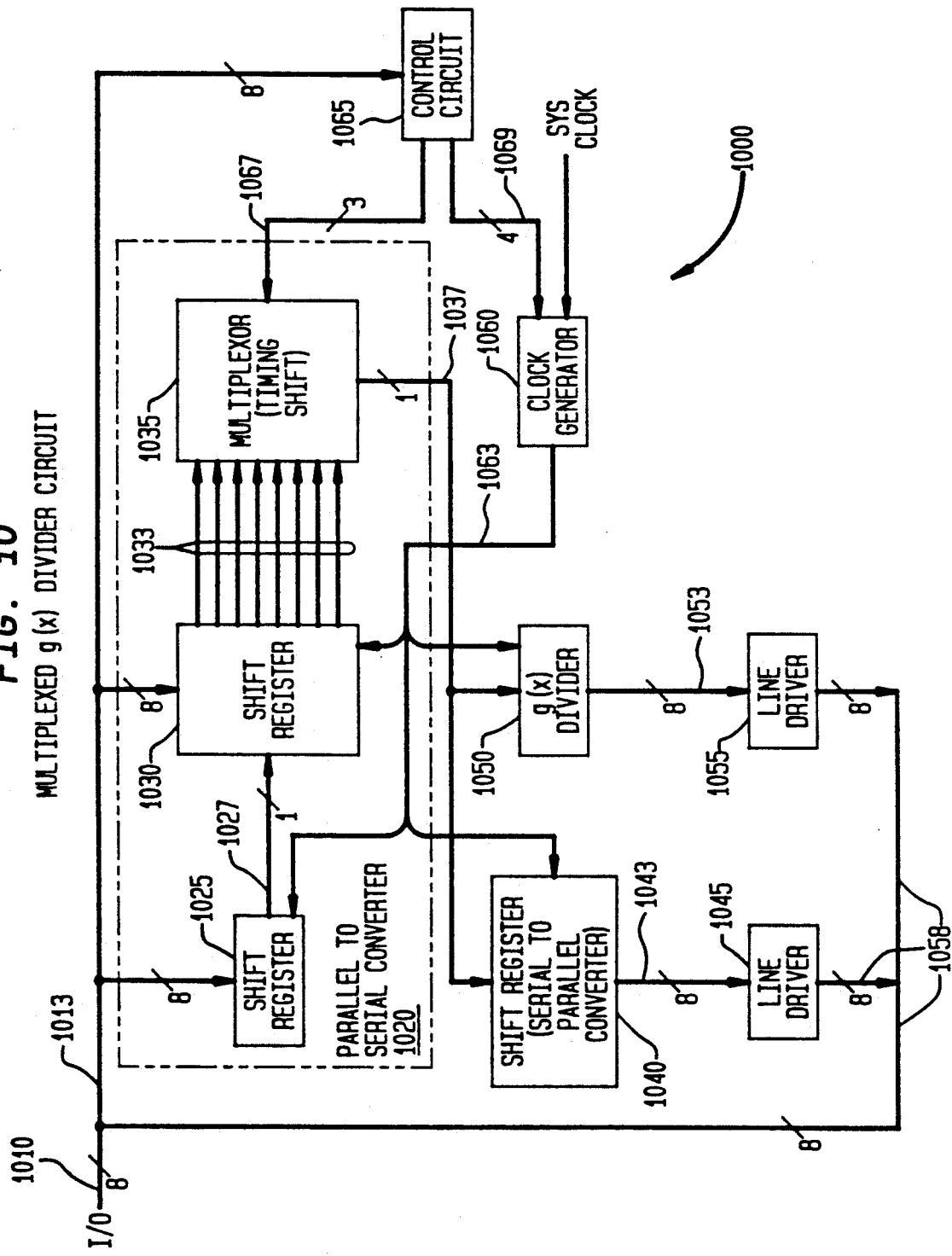
FIG. 10 is a block diagram of multiplexed g(x) divider circuit 1000 that forms part of control section 930 shown in FIG. 9.

This now concludes the discussion of the circuitry used to implement both the port and our inventive technique therein. Accordingly, the discussion will now address the circuitry used to implement the portable as well as the specific implementation of our inventive technique therein. B. Portable Implementation FIG. 8 depicts a functional block diagram of the operations performed within any portable, and specifically within illustrative portable 34 that forms part of system 5 shown in FIG. 1. Though this block diagram does not reflect the actual circuitry of the portable, it simplifies the understanding of the operations performed thereby. Block diagrams of the actual circuitry used to implement a portable are shown in FIGS. 9 and 10 along with flowcharts shown in FIGS. 11, 12A and 12B of appropriate software routines executed within the portable, all of will be discussed in detail below.

As shown, portable 34 provides receiving section 800 and transmitting section 850. In essence, receiving section 800 receives every TDM packet transmitted by a port, demodulates each of these packets, and performs synchronization and error detection on demodulated TDM packets that occur only within the two contiguous TDM time slots within any frame that have been assigned to the portable to carry its current call. Resulting synchronized substantially error-free codewords for these two TDM channels are then converted into encoded digitized speech at a bit rate of 16 kbits/second. The resulting digitized speech is converted into analog form, amplified and applied to a speaker. Transmitting section 850 accepts incoming speech from a microphone and fabricates and transmits an outgoing TDMA burst on a particular TDMA channel, again using two time slots, to the port, i.e. port 30, that is associated with portable 34.

Specifically, within receiving section 800, all incoming TDM transmissions from port 30 (see FIG. 1) that impinge upon antenna 801 are routed, as shown in FIG. 8 via lead 803, to radio (RF) receiver 805 that is tuned to carrier frequency $f_1$. This receiver routes a received analog signal, via lead 807, to demodulator 810 which extracts the multiplexed digitized data that form all of the TDM packets therefrom. The demodulator operates using coherent QPSK demodulation with differential decoding. The TDM bit stream produced by demodulator 810 and appearing on lead 813 is routed both to synchronization and error detection circuit 815 and also to frame initialization block 830. Synchronization and error detection block 815 operates in conjunction with receiver burst processor 820, through a software based implementation of our inventive technique, to provide synchronization recovery and error detection on the words received during the two TDM time slots that have been assigned to the portable to carry a current call. Since forty time slots occur within a TDM frame, any contiguous pair of these slots can be assigned during "call setup" transmissions, to the portable either through prior direct assignment by the port or through prior request by the portable and, if no collisions or conflicts with any prior time slot assignments occur, subsequent assignment by the port during these setup transmissions. In any event, certain results produced by block 815 are the same as those produced by synchronization and error detection circuit 320 that forms part of port 30 shown in FIG. 3: a synch estimation value appearing on lead 816, an error flag appearing on lead 817 and data bits appearing on lead 819, the latter three being shown in FIG. 8.

As discussed above, each portable only needs to provide speech for TDM data that occurs on one particular TDM channel, i.e. two contiguous TDM time slots, which repetitively occurs at the frame rate. In particular, during prior "call setup" transmissions between port 30 (see FIG. 1) and portable 34 and associated with a call that is presently being carried by this portable, the port has assigned two particular contiguous TDM time slots (out of forty slots that form each TDM frame) to this portable to carry this call. In response to this assignment, receiver burst processor 820 and synchronization and error detection circuit 815, shown in FIG. 8, only synchronizes and detects errors associated with received words that occur during these two contiguous time slots. The informational content of two resulting synchronized substantially error-free codewords associated with these slots are then converted by the receiver burst processor into encoded 16 kbits/second digitized speech. The digitized speech is, in turn, applied over lead 824, to digital signal processor 835 which appropriately decodes the speech and applies resulting decoded digital values in byte-wise parallel form to digital to analog (D/A) converter 840. The analog output provided this converter is then amplified, by amplifier 845, to a suitable level to drive speaker 848 located within an appropriate handset.

Since bit slippage may occur between each frame transmitted by the port and received by the portable, frame initialization block 830 and frame counter 825 initially detect the onset of a TDM frame and thereafter establish a timing window, the center of which is advanced or retarded by the amount of observed bit slippage (synch estimation), to correspond to the expected temporal beginning of each subsequent frame. In particular, frame initialization block 830 using pattern matching techniques, preferably correlation, detects the occurrence of the pre-defined sixteen bit synchronization signal in an incoming demodulated TDM packet appearing on lead 813 to obtain initial frame synchronization. Once this pattern has been matched, frame initialization block 830 generates a framing match pulse over leads 833 to initially reset frame counter 825. This counter then generates a burst pulse over lead 827 coincident with the beginning of each frame. Once initial synchronization has been established, frame initialization block 830 disables itself until framing is "grossly" lost or never existed and needs to be established. Specifically, a pulse occurring on leads 833 is routed to the disable input of frame initialization block 830 to inhibit further pattern matching. Whenever pattern matching is to resume, i.e. where synchronization has not yet occurred at all or a "gross" loss of synchronization is likely have occurred, such as when a new call is placed or handoff occurs or every time a portable comes out of a "fading" swell, receiver burst processor 820 applies a pulse to lead 821 to enable frame initialization block 830 to once again perform pattern matching and recover framing. Based upon the synch estimation value provided for the two words of interest by receiver burst processor 820, the receiver burst processor applies a suitable value to lead 823 to either advance or retard the counting performed by the frame counter by up to $\pm 6$ bits such that the burst pulse, which should be coincident with the start of the next frame, remains within the center of the $\pm 6$ bit timing window. The burst pulse appearing on lead 827 is applied to control the timing of synchronization and error detection block 815. Since the portable transmits a TDMA burst in response to a TDM packet, the timing of its transmitter section is slaved to that of its receiver section. Accordingly, burst pulses appearing on leads 827 are also routed to channel coder 880 in portable transmitter section 850.

As noted, transmitting section 850 accepts incoming speech from a handset and fabricates and transmits to port 30 two outgoing TDMA bursts that collectively form one TDMA channel. Specifically, incoming speech from microphone 855 in a handset is applied through amplifier 860 to analog-to-digital (A/D) converter 865 that produces a succession of corresponding equivalent parallel digital values. These digital values are applied as input to digital signal processor 870 which suitably encodes these values into a serial stream of 16 kbits/second speech. The 16 kbit/second digital bit stream appearing on lead 873 is then routed to an input of transmitter burst processor 875. This burst processor merely converts the encoded speech into two 147-bit informational bit streams in much the same fashion as does transmitter burst processor 380 (see FIG. 3) in port 30.

Each resulting 147-bit informational bit stream is applied by the transmitter burst processor over lead 878 to channel coder 880. The channel coder calculates fourteen parity bits for each 147-bit informational bit stream using a given g(x) generator for a CRC code, as discussed in detail below, appends the resulting fourteen parity bits to that stream to form a codeword and modifies the resulting CRC codeword to include marker bits. The channel coder also inserts three dummy bits into each stream prior to the beginning of each codeword, as discussed above, to form a TDMA burst. The resulting TDMA burst is applied, via lead 883, to modulator 885. The modulator modulates this TDMA burst onto a carrier frequency using differentially encoded QPSK. A resulting analog signal appearing over lead 888 is applied to radio (RF) transmitter 890 for transmission over carrier frequency $f_2$, via lead 893 and antenna 898, to the port, i.e. port 30 (see FIG. 1), associated with portable 34.

Instead of using three separate g(x) dividers as occurs in the port, portable 34, as described in detail below, actually uses a single g(x) divider that is multiplexed through software control to implement the channel coding, synchronization and error detection functions.

Through use of our technique, the secondary clock established by frame counter 825, which operates within a software phase locked loop as described in detail below, could eliminate the need for the port to transmit the pre-defined 16-bit synchronization code with every TDM packet. As noted, the portable uses the 16-bit synchronization pattern to obtain synchronization only under various conditions, e.g. when a portable first places a call through a TDMA channel, when handoff occurs and every time the portable comes out of a "fading" swell. Upon obtaining synchronization, the portable could transmit a suitable signal to the port. Accordingly, the port could then cease transmitting the 16-bit synchronization pattern and allocate these bits to carrying other information. If the portable subsequently lost synchronization and so informed the port or the portable failed to respond to a port transmission within a given timeout interval, e.g. a few hundred milliseconds or even one second, such that a "gross" synchronization error likely occurred, then appropriate software executing in the port transmitter burst processor could appropriately insert the synchronization pattern back into the TDM packets transmitted to that portable so as to permit the software phase locked loop executing therein to again attain phase lock and thereafter maintain synchronization of subsequently received TDM packets.

FIG. 9 depicts a detailed block diagram of the circuitry used to implement portable 34. As shown, portable 34 is formed of speech section 910, control section 930 and radio link section 970. The speech section contains handset 915 and speech processor 920. The handset contains a keypad for generating DTMF (dual tone multi-frequency) tones, a microphone and a speaker, the latter three components are all well-known and not specifically shown. The handset accepts speech from a caller and supplies it as well as tone output from the keypad in analog form over leads 917 to speech processor 920 and accepts outgoing analog speech from the speech processor for connection over leads 917 to the speaker. The speech processor includes the digital signal processors, A/D and D/A converters and amplifiers, and certain functions performed by the burst processors, all as specifically shown in FIG. 8. The speech processor converts incoming speech and DTMF tones from handset 915 into 147-bit informational bit streams and decodes outgoing 147-bit informational bit streams into analog speech for application to the handset. The incoming and outgoing informational bit streams appear over bus 925 and are transferred in byte-wise 8-bit parallel form either from or to the speech processor using direct memory access (DMA) operations involving both the speech processor and random access memory (RAM) 960. Two contiguous 147-bit bit streams occurring on two successive TDM time slots that have been assigned to this portable are transferred at a rate from and to the speech processor that yields a desired 16 kbit/second bit rate.

Control section 930 contains microprocessor 950, which is preferably an Hitachi model HD 64180 8-bit microprocessor operating at a 6 MHz clock frequency, that is connected through address/data bus 925 to RAM 960 and ROM 965, and through 8-bit input/output (I/O) leads 955 to counter 940, frame sync detector 945, multiplexed g(x) divider circuit 1000 and to modulator/demodulator 975—the latter being within radio link section 970. RAM 960 is preferably implemented using static RAM circuits and serves as a common memory space, or buffer, for both speech processor 920 and microprocessor 950 for use in processing incoming TDM packets and forming outgoing TDMA bursts. ROM 965 stores the control program executed by microprocessor 950. System clock 935 provides the necessary 6 MHz clock signals for microprocessor 950 as well as other system clock signals (not specifically shown) that are required by all the other circuitry connected to the microprocessor. Frame sync detector 945 performs pattern matching on the 16-bit pre-defined synchronization pattern contained within incoming demodulated digital TDM packets, appearing in serial form over lead 977, to provide over I/O leads 943 and 955 a signal indicative of initial frame synchronization. This detector provides the same function as does frame initialization block 830 shown in FIG. 8. Once initial synchronization has been established, frame sync detector 945 is disabled by the microprocessor until framing is "grossly" lost, as in the case of a "fading" swell or handoff condition and needs to be re-established or if framing never existed and needs to be initially established as occurs with a new call. Counter 940 generates a burst pulse over leads 943 and 955 coincident with the beginning of each frame. The timing of this burst is either appropriately advanced or retarded within a $\pm 6$ bit window by the microprocessor to maintain the burst pulse within the center of the timing window as bit slippage in the received TDM packets occurs. The amount of bit slippage, i.e. the synch estimation value, is applied to this counter over I/O leads 943 and 955 by the microprocessor. As such, counter 940 provides the same function as frame counter 825 shown in FIG. 8 and described in detail above. Counter 940 operates as part of a software phase locked loop which maintains synchronization of incoming TDM words. Use of this phase locked loop, as previously discussed, could advantageously eliminate the need for the port to transmit the pre-defined 16-bit synchronization code with every TDM packet. Multiplexed g(x) divider circuit 1000 contains appropriate parallel-to-serial and serial-to-parallel converters and a single g(x) divider. This divider is multiplexed, as described in detail below, through software control by microprocessor 950 in order to implement the channel coding, synchronization and error detection functions discussed above.

Radio link section 970 contains modulator/demodulator 975, radio transmitter 980 and receiver 985, antenna transmit/receive switch 990 and antenna 995. Modulator/demodulator 975 performs QPSK modulation using differential encoding on 164-bit outgoing TDMA bursts and QPSK demodulation using differential decoding on incoming 180-bit TDM packets, as described above. Incoming demodulated TDM packets are applied by modulator/demodulator 975 over leads 977 to frame sync detector 945 and also, via DMA operations, in byte-wise parallel form into RAM 960 via I/O leads 955 and microprocessor 950. Outgoing 164-bit TDMA bit streams are routed, again using DMA operations, via RAM 960 and microprocessor 950 and I/O leads 955, for modulation and subsequent transmission to a modulator within modulator/demodulator 975. Outgoing modulated TDMA bursts are routed in analog form by modulator/demodulator 975, via lead 979 to RF transmitter 980 and, from there, via lead 983 and antenna transmit/receive switch 990 to antenna 995 for transmission on carrier frequency $f_2$ to the port. For reception, antenna transmit/receive switch 990 is set to an opposite position to enable incoming TDM packets transmitted by the port and impinging on antenna 995 to be routed through lead 981 to RF receiver 985. This receiver, tuned to carrier frequency $f_1$, routes received TDM packets appearing on this carrier frequency in analog form over lead 988 to an input of a demoulator within modulator/demodulator 975.

FIG. 10 is a block diagram of multiplexed g(x) divider circuit 1000 that forms part of control section 930 shown in FIG. 9. As discussed above, this divider circuit contains one g(x) divider that is multiplexed, under software control, for use in performing three separate functions: channel coding, synchronization and error detection. Divider 1050 is identical to divider 430 shown in FIG. 5 and discussed in detail above.

Specifically, as shown in FIG. 10, circuit 1000 contains parallel-to-serial converter 1020, shift register 1040, g(x) divider 1050, line drivers 1045 and 1055, clock generator 1060 and control circuit 1065. Parallel-to-serial converter 1020, which contains cascaded 8-bit shift registers 1025 and 1030 and 8-bit multiplexer 1035, converts the incoming eight-bit bytes on I/O leads 1010 and 1013 into appropriate serial form and applies the resulting bit stream to lead 1037. The parallel eight-bit output of shift register 1030 is applied, via leads 1033, to corresponding inputs of multiplexer 1035. In particular, the microprocessor loads each, 8-bit byte of data that is to be encoded by g(x) or needs to have a timing or error syndrome value determined, from RAM 960 (see FIG. 9) into shift registers 1025 or 1030, as shown in FIG. 10. The first and second bytes are loaded into shift registers 1030 and 1025, respectively, and successive bytes are loaded into shift register 1025. After the first two bytes are loaded, then, through suitable shift pulses applied to shift registers 1025 and 1030, these bytes are converted into a serial bit stream. Prior to the transfer of these bytes, multiplexer 1035 is suitably programmed by the microprocessor and control circuit 1065, using a three bit value appearing on leads 1067, to tap, via one of leads 1033, the actual beginning of an incoming word, whether that word has been previously encoded with parity bits or has not yet been encoded, from an arbitrary bit position of the first data byte loaded into shift register 1030. Thereafter, these shift registers are shifted by eight bits to serially route this byte of data, via lead 1037, into shift register 1040, which functions as a serial-to-parallel converter), and g(x) divider 1050. This process is then repeated for each subsequent 8-bit byte of data that is to be encoded by g(x) or used to determine a timing or error syndrome value associated therewith. The last bit of data will end at an arbitrary bit position within the last byte. Accordingly, prior to the transfer of this last byte into shift register 1025, control circuit 1065 will be programmed by the microprocessor to instruct clock generator 1060 to only produce a corresponding number of shift pulses for this last byte that shifts only the remaining data bits into the g(x) divider. Once 161 shifts have occurred, the microprocessor will read the syndrome produced by g(x) divider 1050 in 8-bit bytes using line drivers 1055. This syndrome value will be used as parity bits or as timing or error syndrome values depending upon whether the microprocessor is using g(x) divider 1050 for channel coding, synchronization or error detection.

Clock generator 1060, which is implemented with programmable counters, uses the 6 MHz microprocessor system clock as a base timing reference to generate suitable programmable shift pulses that appear on leads 1063 to control shift registers 1025, 1030, 1040 and g(x) divider 1050 wherein the pulse counts and relative timing of the shift pulses are specified by the control signals appearing on leads 1069. Control circuit 1065 receives suitable control instructions from the microprocessor over I/O leads 1010 and supplies three control bits over leads 1067 to multiplexer 1035 and four control bits over leads 1069 to clock generator 1060. As such, the clock generator assures that data is properly fed into g(x) divider 1050. In this regard, the clock generator produces a given number of clock bits to load a byte of data into the g(x) divider and stops until the next byte is available from shift register 1030. This number is initialized by the microprocessor prior to the transfer of any data into the divider.

While data is being applied to g(x) divider 1050 over leads 1037, these leads also apply the same data to an input of shift register 1040 which functions as a serial-to-parallel converter. This converter is used to facilitate burst timing adjustment during the synchronization pass. Specifically, through this register, a received word for which its timing syndrome has just been determined is converted back into parallel form and applied, via leads 1043 through line drivers 1045 and leads 1058, back to I/O leads 1010 and leads 1013. The received word is then applied to the parallel inputs of shift registers 1025 and 1030. Prior to the transfer of this received word into these shift registers, multiplexer 1035 is programmed, by the microprocessor and control circuit 1065, to impart a proper serial timing offset to this word, as the burst timing adjustment, and thereby properly synchronize this word. The resulting synchronized codeword produced by multiplexer 1035 in serial form on lead 1037 is applied to g(x) divider 1050 for the error detection pass and specifically to determine the error syndrome therefor. Simultaneously, the synchronized word is read back in parallel form by the microprocessor through shift register 1040.

As discussed above, the channel coding, synchronization and error detection functions are performed within the portable by the microprocessor executing appropriate software in conjunction with use of multiplexed g(x) circuit 1000. This software is formed of two routines; namely, Portable Channel Coding Interrupt Routine 1100 and Portable Synchronization and Error Detection Interrupt Routine 1200, that respectively execute at appropriate times on an interrupt basis whenever a codeword is to be transmitted in a TDMA burst or a word has been received via a TDM packet.

Figure 11:
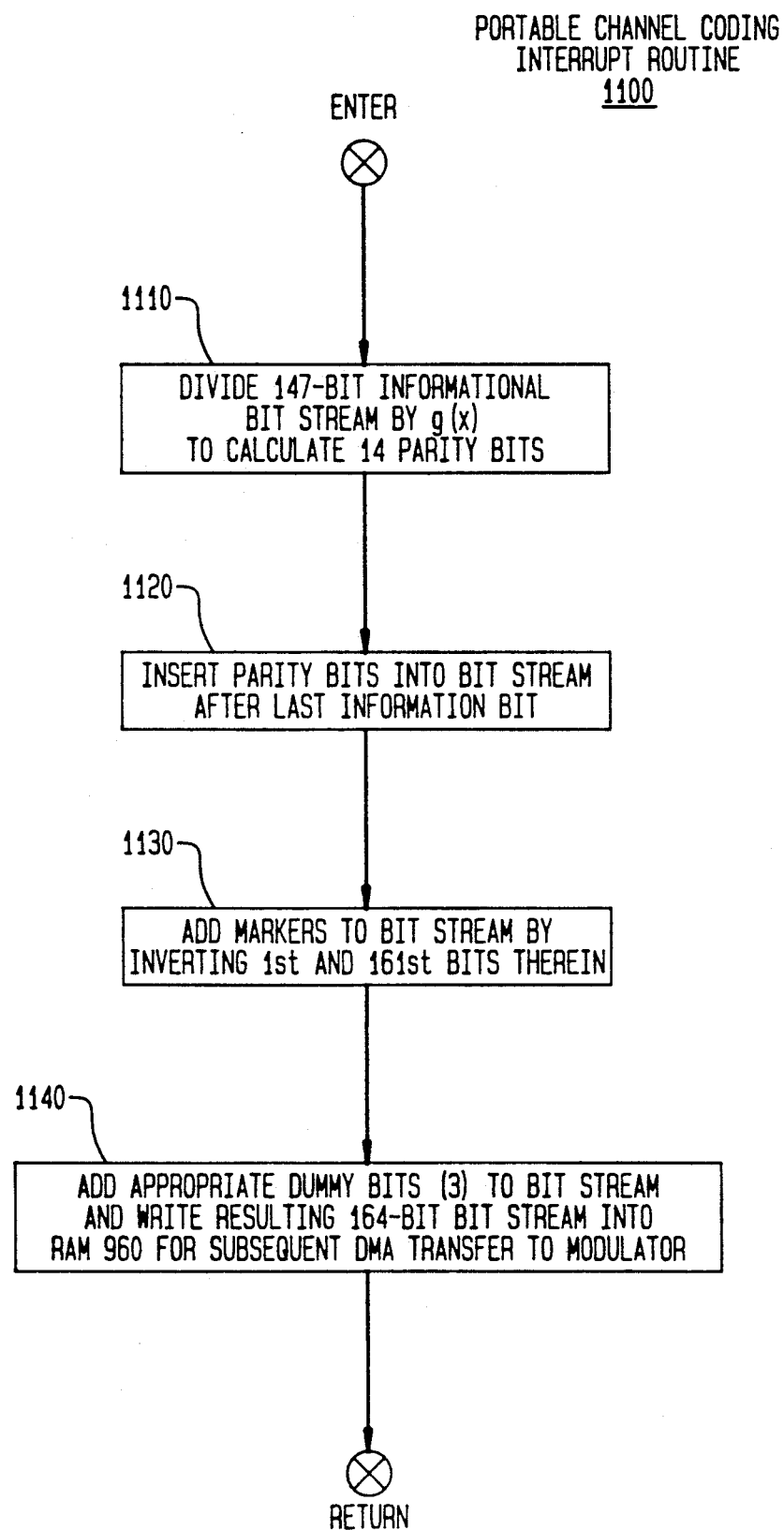
FIG. 11 depicts a high level flowchart of Portable Channel Coding Interrupt Routine 1100 that is executed on an interrupt basis by microprocessor 950 located within portable 34 as shown in FIG. 9.

FIG. 11 depicts a high level flowchart of Portable Channel Coding Interrupt Routine 1100. This routine performs channel coding of 147-bit informational bit streams that are to be transmitted as 164-bit TDMA bursts.

In particular, upon entry into routine 1100, execution first proceeds to block 1110 which, when executed, divides a 147-bit informational bit stream by g(x) to calculate 14 corresponding parity bits. Thereafter, execution proceeds to block 1120 which, when executed, inserts these parity bits into this bit stream after the last one of the 147 information bits thereby forming a 161-bit codeword. Once this occurs, block 1130 is executed to add marker bits, specifically the first set thereof, to this codeword by inverting the values of the first and 161st bits in this bit stream. Next, execution proceeds to block 1140 which inserts three appropriate dummy bits into this bit stream prior to the first informational bit and writes the resulting 164-bit bit stream for a new TDMA burst into RAM memory 960 for subsequent DMA transfer to the modulator situated within modulator/demodulator 975 (see FIG. 9). Once block 1140 is fully executed, then, as shown in FIG. 11, execution exits from routine 1100 and appropriately returns to a calling program or routine.

Figure 12:
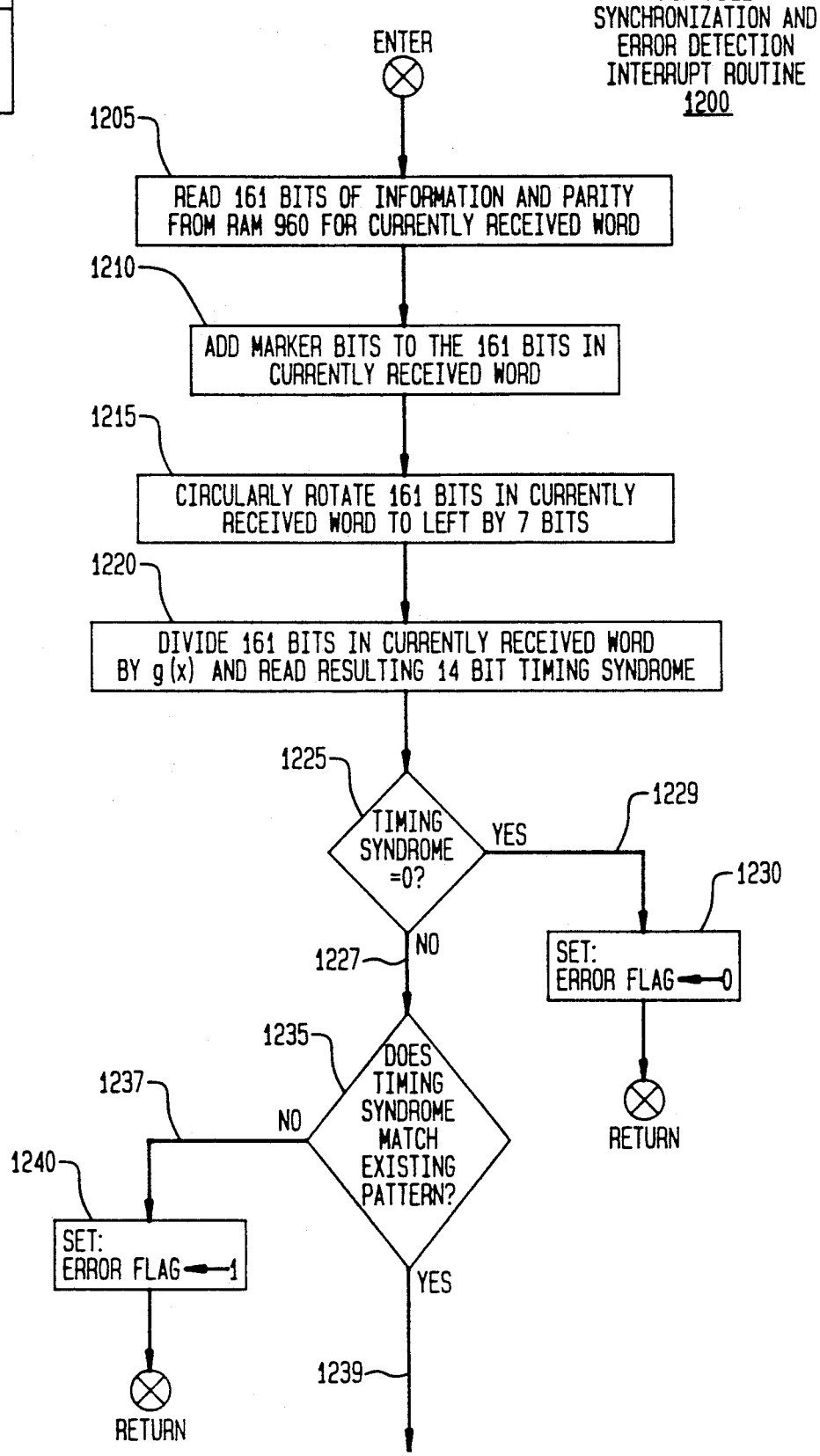
FIG. 12 shows the correct alignment of the drawing sheets for FIGS. 12A and 12B.
Figure 12B:
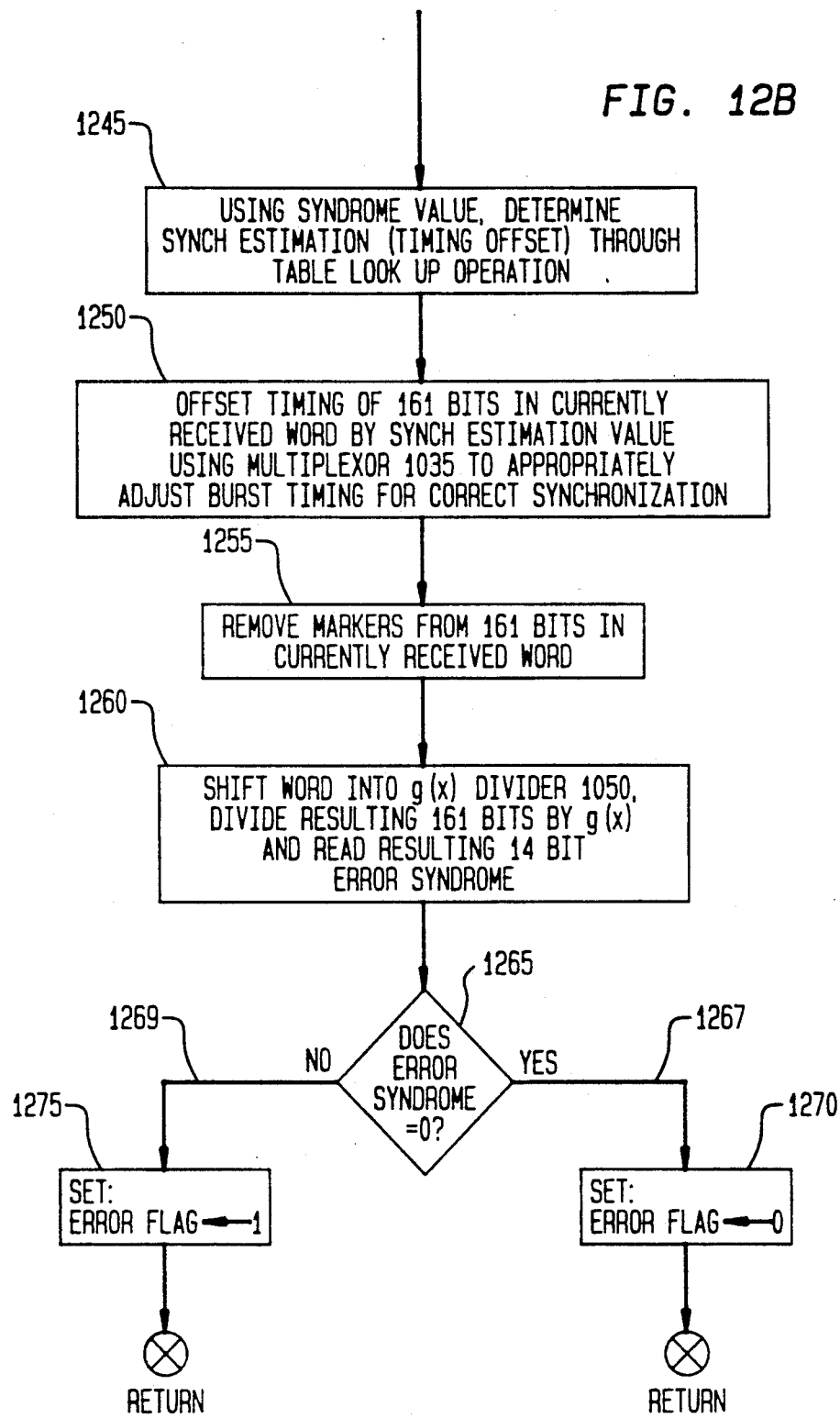

FIGS. 12A and 12B collectively depict a high level flowchart of Portable Synchronization and Error Detection Interrupt Routine 1200; the correct alignment of the drawing sheets for these figures is shown in FIG. 12. This routine performs synchronization and error detection on received TDM words.

Specifically, upon entry into routine 1200, execution first proceeds to block 1205. This block, when executed, reads a 161-bits of information and parity from RAM 960 (see FIG. 9) for the word in the currently received TDM packet. Once this occurs, as shown in FIGS. 12A and 12B, block 1210 executes to add marker bits, specifically the second set thereof, to this word by inverting the first and 161st bits in this word. Thereafter, execution proceeds to block 1215 which circularly rotates the 161 bits in the currently received, now marked, word to the left by 7 bit positions. After this rotation is complete, execution proceeds to block 1220 which divides the resulting 161 bits by polynomial g(x) and reads a resulting timing syndrome value. Once this syndrome value has been obtained, execution passes to decision block 1225. This decision block determines if the timing syndrome value equals zero. If this syndrome value is zero, then no errors, either synchronization or erroneous bit(s), have occurred in the received word. Accordingly, decision block 1230 passes routes execution, via YES path 1229, to block 1230 which, when executed, sets the value of a software Error Flag to "zero". Execution then exits from routine 1200 and appropriately returns to a calling program or routine.

Alternatively, in the event that this timing syndrome value is not zero, then decision block 1225 routes execution, via NO path 1227, to decision block 1235. This latter decision block determines whether this timing syndrome value matches any of the pre-defined values for bit slippages occurring between ±6 bits inclusive, i.e. those syndrome values shown in table 610 in FIG. 6. In part, this matching can simply be effected by counting the bit spacings that occur between delimiting marker ("1") bits in the timing syndrome. In the event a match was not found, thereby indicating excessive slippage or bit errors have occurred in the currently received word, then decision block routes execution, as shown in FIGS. 12A and 12B via NO path 1237, to block 1240 which, when executed, sets the software Error Flag to "one" to signify that this word has errors and should be subsequently ignored. Execution then exits from routine 1200 and appropriately returns to a calling program or routine. By ignoring this erroneous word, the portable essentially "flywheels" using the previous synchronized substantially error-free codeword until the next successive synchronized substantially error-free codeword subsequently occurs. If, however, the non-zero timing syndrome value matches one of the pre-defined patterns, then decision block 1235 routes execution, via YES path 1239, to block 1245. Block 1245 determines the synch estimation (timing offset) value through table 610 shown in FIG. 6 for the current timing syndrome value. Once this synch estimation value has been determined, execution proceeds to block 1250 shown in FIGS. 12A and 12B. This block, when executed, offsets the timing of the currently received 161-bit word by the value of the synch estimation by appropriately programming multiplexer 1035 located within multiplexed g(x) divider circuit 1000 shown in FIG. 10. Once the offset has been programmed into the multiplexer, execution proceeds, as shown in FIGS. 12A and 12B, to block 1255 which removes the marker bits, specifically the first set thereof, from this word by inverting the first and 161st bits of this word so as to form an unmarked word. Once this has occurred, execution proceeds to block 1260 which instructs control circuit 1065 in circuit 1000 to shift bits through multiplexer 1035, so as to advance or retard and thereby correct the timing of these bits, and thereafter into g(x) divider 1050 in order to determine the error syndrome for this unmarked word (see FIG. 10). After the unmarked word has been completely shifted into the divider, the resulting error syndrome produced by this divider is then read. Thereafter, execution proceeds to decision block 1265, as shown in FIGS. 12A and 12B, to test the value of the resulting error syndrome. In the event the error syndrome is non-zero (any of its bits is "1"), i.e. signifying that one or more bit errors occur in the word in the currently received TDM packet, then decision block 1265 routes execution, via NO path 1269, to block 1275. Block 1275, when executed, sets the value of the software Error Flag to "one" to signify that this word is erroneous and should be subsequently ignored. Alternatively, if the error syndrome is zero-valued, then decision block 1265 routes execution, via YES path 1267, to block 1270 which sets the software Error Flag to "zero" to indicate that the unmarked word is a synchronized and substantially error-free codeword and should be subsequently used. Once block 1275 or 1270 has executed, then execution then exits from routine 1200 and appropriately returns to a calling program or routine.

Through mathematical analysis and computer simulation, we have determined the performance that can be expected through use of our inventive technique with a (161, 147) code, that is capable of correcting bit slippages of up to ±6 bits, on a slow Rayleigh fading channel using coherent QPSK demodulation with differential decoding which is what is expected to occur on a TDM/TDMA radio channel in low power digital telephony. For a 14 bit CRC code operating with continuous and correct synchronization on this channel, the falsing rate theoretically should be $2^{-14}$, or approximately 1 block out of 10,000 transmitted blocks.

On the other hand, if synchronization were to be performed but without error detection, then we would expect that the falsing rate using this code on this channel should be on the order of $2^{-6}$ to $2^{-7}$, or approximately 1 out of every 100 blocks. Through our analysis and simulation, we have determined that through use of our inventive two-pass technique for both synchronization and error detection, the resulting falsing rate will be on the order of approximately $2^{-11}$ (approximately $7 \times 2^{-14}$), or approximately 1 out of every 1500 blocks, resulting in a three bit degradation in the falsing rate capability provided by the code if it was used only for error detection. While this degraded falsing rate is not necessarily low enough to assure that data will be reliably carried on an error-free basis through this channel, it is sufficiently low to assure that speech will be reliably carried at a level of quality that is easily commensurate with that provided by a conventional wireline telephone. To determine the actual performance that can be expected from our technique, we have also successfully implemented our technique in an experimental hardware prototype of a portable and have measured its performance under transmission conditions. Our measurements advantageously indicate that the actual performance of our technique substantially agrees with our simulation and mathematical analysis. As such, our inventive technique jointly provides both synchronization and error detection in a much more implementationally efficient and cost effective manner than would use of separate error detection and synchronization processes such as that taught in the art, though at a cost, which is readily tolerable in speech transmission, of a slightly degraded falsing rate than that which would otherwise result if these separate processes were to be employed.

Clearly, by now, those skilled in the art realize that substantially any other cyclic code can be used in lieu of the illustrative though preferred (161,147) code described herein. In addition, many any other generator polynomials for g(x) can be used in lieu of that specified in equation (1) above provided that the same polynomial is consistently used for channel coding, synchronization and error detection in both the ports and all portables associated therewith. Of course, if other cyclic codes are used with different generator polynomials, then it is quite likely that the informational bit rate provided by the codewords resulting therefrom as well as the actual falsing rate obtained thereby will likely vary from those described above for a (161,147) cyclic code.

Although two different embodiments which incorporate the teachings of the present invention have been shown and described in detail herein, those skilled in the art can readily devise many other varied embodiments that still incorporate these teachings.

We claim:

1. A method for performing bit synchronization and error detection on a received word having first marker bits and for providing a synchronized substantially error-free cyclic codeword corresponding thereto to an output point comprising the steps of:

inserting second marker bits into said received word so as to form a marked received word;

determining, in response to said marked received word, a multi-bit timing syndrome value therefor and, in response thereto, a corresponding value of bit slippage associated therewith;

advancing or retarding the received word by an amount of bit positions and in a direction specified by said bit slippage value to yield an intermediate word;

removing the first marker bits from said intermediate word to yield an unmarked word;

determining, in response to said unmarked word, a multi-bit error syndrome value therefor; and testing said error syndrome value to determine whether no bit errors exist in said unmarked word and, in the event said bit errors do not exist providing said unmarked word as the synchronized substantially error-free codeword to the output point.

2. The method in claim 1 wherein said multi-bit timing syndrome value and bit slippage determining step comprises the step of dividing the marked received word by a binary polynomial generator g(x) to yield said timing syndrome value, and wherein said error syndrome determining step comprises the step of dividing the unmarked word by the binary polynomial generator g(x) to yield said error syndrome value.

3. The method in claim 2 wherein the second marker bits inserting step comprises the step of inverting values of first and last bits in said received word, and wherein said first marker bits removing step comprises the step of inverting values of first and last bits in said intermediate word.

4. The method in claim 3 wherein said multi-bit timing syndrome and bit slippage determining step comprises the step of accessing a look-up table given the timing syndrome value to generate the corresponding bit slippage value associated therewith.

5. The method in claim 3 further comprising the step of circularly rotating the marked received word to the left by a pre-determined number of bit positions prior to performing the timing syndrome value and bit slippage determining step.

6. The method in claim 3 wherein said polynomial generator g(x) is $x^{14}+x^{11}+x^5+x^4+x^3+x^2+1$.

7. The method in claim 3 wherein said testing step comprises the step of providing a pre-defined indication to signify that said unmarked word provided to said output point is the synchronized substantially error-free codeword.

8. The method in claim 3 wherein said received word forms part of either an incoming TDMA burst or TDM packet.

9. The method in claim 8 wherein said synchronized substantially error-free codeword is a (161,147) cyclic codeword.

10. A method for transmitting an informational bit stream of digital data through a communication channel from a transmitter to a receiver and at said receiver for recovering bit synchronization and performing error detection of a corresponding received bit stream comprising the steps of:
at the transmitter:
determining a plurality of parity bits for the informational bit stream;
generating a first cyclic codeword formed of the informational bit stream and said parity bits;
inserting first marker bits in said first cyclic codeword so as to form a marked first cyclic codeword; and
transmitting a first burst comprising said marked first cyclic codeword over said channel to said receiver; and
at the receiver:
receiving a second burst corresponding to said transmitted first burst from said channel and extracting from said second burst a first word corresponding to said marked first cyclic codeword;
inserting second marker bits into said first word so as to form a marked received word;
determining, in response to said marked received word, a multi-bit timing syndrome value therefor and, in response thereto, a corresponding value of bit slippage associated therewith;
advancing or retarding the received word by an amount of bit positions and in a direction specified by said bit slippage value to yield an intermediate word;
removing the first marker bits from said intermediate, word to yield an unmarked word;
determining, in response to said unmarked word, a multi-bit error syndrome value therefor; and testing said error syndrome value to determine whether no bit errors exist in said unmarked word and, in the event, said bit errors do not exist, providing said unmarked word as a synchronized substantially error-free codeword to an output point.

11. The method in claim 10 wherein said parity bits determining step comprises the step of dividing the informational bit stream by a binary polynomial generator g(x) to yield the parity bits; wherein the multi-bit timing syndrome value and bit slippage determining step comprises the step of dividing the marked received word by the binary polynomial generator g(x) to yield said timing syndrome value; and wherein said error syndrome determining step comprises the step of dividing the unmarked word by the binary polynomial generator g(x) to yield said error syndrome value.

12. The method in claim 11 wherein the second marker bits inserting step comprises the step of inverting values of first and last bits in said first word, and wherein said first marker bits removing step comprises the step of inverting values of first and last bits in said intermediate word.

13. The method in claim 12 wherein said first cyclic codeword generating step comprises the step of inserting the parity bits after the informational bit stream to form the first cyclic codeword.

14. The method in claim 13 wherein said polynomial generator g(x) is $x^{14}+x^{11}+x^5+x^4+x^3+x^2+1$.

15. The method in claim 13 wherein said multi-bit timing syndrome and bit slippage determining step comprises the step of accessing a look-up table given the timing syndrome value to generate the corresponding bit slippage value associated therewith.

16. The method in claim 13 further comprising the step of circularly rotating the marked received word to the left by a pre-determined number of bit positions prior to performing the timing syndrome value and bit slippage determining step.

17. The method in claim 13 wherein said testing step comprises the step of providing a pre-defined indication to signify that said unmarked word provided to said output point is the synchronized substantially error-free codeword.

18. The method in claim 13 wherein said first word forms part of either a TDMA burst or TDM packet.

19. The method in claim 18 wherein said first cyclic codeword and said synchronized substantially error-free codeword are each a (161,147) cyclic codeword.

20. Apparatus for performing bit synchronization and error detection on a received word having first marker bits and for providing a synchronized substantially error-free cyclic codeword corresponding thereto to an output point comprising:
means for inserting second marker bits into said received word so as to form a marked received word;
means for determining, in response to said marked received word, a multi-bit timing syndrome value therefor and, in response thereto, a corresponding value of bit slippage associated therewith;
means for advancing or retarding the received word by an amount of bit positions and in a direction specified by said bit slippage value to yield an intermediate word;
means for removing the first marker bits from said intermediate word to yield an unmarked word;

means for determining, in response to said unmarked word, a multi-bit error syndrome value therefor; and means for testing said error syndrome value to determine whether no bit errors exist in said unmarked word and, in the event said bit errors do not exist providing said unmarked word as the synchronized substantially error-free codeword to the output point.

21. The apparatus in claim 20 wherein said multi-bit timing syndrome value and bit slippage determining means comprises means for dividing the marked received word by a binary polynomial generator g(x) to yield said timing syndrome value, and wherein said error syndrome determining means comprises means for dividing the unmarked word by the binary polynomial generator g(x) to yield said error syndrome value.

22. The apparatus in claim 21 wherein said second marker bits inserting means comprises means for inverting values of first and last bits in said received word, and wherein said first marker bits removing means comprises means for inverting values of first and last bits in said intermediate word.

23. The apparatus in claim 22 wherein said multi-bit timing syndrome and bit slippage determining means comprises means for accessing a look-up table given the timing syndrome value to generate the corresponding bit slippage value associated therewith.

24. The apparatus in claim 22 further comprising means for circularly rotating the marked received word to the left by a pre-determined number of bit positions.

25. The apparatus in claim 22 wherein said polynomial generator g(x) is $x^{14}+x^{11}+x^5+x^4+x^3+x^2+1$.

26. The apparatus in claim 22 wherein said testing means comprises means for providing a pre-defined indication to signify that said unmarked word provided to said output point is the synchronized substantially error-free codeword.

27. The apparatus in claim 22 wherein said received word forms part of either an incoming TDMA burst or TDM packet.

28. The apparatus in claim 27 wherein said synchronized substantially error-free codeword is a (161,147) cyclic codeword.

29. Apparatus for transmitting an informational bit stream of digital data through a communication channel from a transmitter to a receiver and at said receiver for recovering bit synchronization and performing error detection of a corresponding received bit stream comprising:

means for determining a plurality of parity bits for the informational bit stream;

means for generating a first cyclic codeword formed of the informational bit stream and said parity bits;

means for inserting first marker bits in said first cyclic codeword so as to form a marked first cyclic codeword; and means for transmitting a first burst comprising said marked first cyclic codeword over said channel to said receiver;

means for receiving a second burst corresponding to said transmitted first burst from said channel and extracting from said second burst a first word corresponding to said marked first cyclic codeword;

means for inserting second marker bits into said first word so as to form a marked received word;

means for determining, in response to said marked received word, a multi-bit timing syndrome value therefor and, in response thereto, a corresponding value of bit slippage associated therewith;

means for advancing or retarding the received word by an amount of bit positions and in a direction specified by said bit slippage value to yield an intermediate word;

means for removing the first marker bits from said intermediate word to yield an unmarked word;

means for determining, in response to said unmarked word, a multi-bit error syndrome value therefor; and means for testing said error syndrome value to determine whether no bit errors exist in said unmarked word and, in the event, said bit errors do not exist, providing said unmarked word as a synchronized substantially error-free codeword to an output point.

30. The apparatus in claim 29 wherein said parity bits determining means comprises means for dividing the informational bit stream by a binary polynomial generator g(x) to yield the parity bits; wherein the multi-bit timing syndrome value and bit slippage determining means comprises means for dividing the marked received word by the binary polynomial generator g(x) to yield said timing syndrome value; and wherein said error syndrome determining means comprises means for dividing the unmarked word by the binary polynomial generator g(x) to yield said error syndrome value.

31. The apparatus in claim 30 wherein said second marker bits inserting means comprises means for inverting values of first and last bits in said first word, and wherein said first marker bits removing means comprises means for inverting values of first and last bits in said intermediate word.

32. The apparatus in claim 31 wherein said first cyclic codeword generating means comprises means for inserting the parity bits after the informational bit stream to form the first cyclic codeword.

33. The apparatus in claim 32 wherein said polynomial generator g(x) is $x^{14}+x^{11}+x^5+x^4+x^3+x^2+1$.

34. The apparatus in claim 32 wherein said multi-bit timing syndrome and bit slippage determining means comprises means for accessing a look-up table given the timing syndrome value to generate the corresponding bit slippage value associated therewith.

35. The apparatus in claim 32 further comprising means for circularly rotating the marked received word to the left by a pre-determined number of bit positions.

36. The apparatus in claim 32 wherein said testing means comprises means for providing a pre-defined indication to signify that said unmarked word provided to said output point is the synchronized substantially error-free codeword.

37. The apparatus in claim 32 wherein said first word forms part of either a TDMA burst or TDM packet.

38. The apparatus in claim 37 wherein said first cyclic codeword and said substantially error-free codeword are each a (161,147) cyclic codeword.

* * * * *